(12) United States Patent
Hojo et al.

(10) Patent No.: US 10,186,473 B2
(45) Date of Patent: Jan. 22, 2019

(54) POWER MODULE

(71) Applicant: Hitachi Automotive Systems, Ltd., Hitachinaka-shi, Ibaraki (JP)

(72) Inventors: Fusao Hojo, Tokyo (JP); Nobutake Tsuyuno, Tokyo (JP); Toshiaki Ishii, Tokyo (JP); Junpei Kusukawa, Tokyo (JP); Akira Matsushita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/747,365

(22) PCT Filed: Jul. 11, 2016

(86) PCT No.: PCT/JP2016/070362
§ 371 (c)(1),
(2) Date: Jan. 24, 2018

(87) PCT Pub. No.: WO2017/022414
PCT Pub. Date: Feb. 9, 2017

(65) Prior Publication Data
US 2018/0218963 A1 Aug. 2, 2018

(30) Foreign Application Priority Data

Jul. 31, 2015 (JP) ................................. 2015-151455

(51) Int. Cl.
*H01L 21/00* (2006.01)
*H01L 23/373* (2006.01)
(Continued)

(52) U.S. Cl.
CPC .......... *H01L 23/3733* (2013.01); *H01L 23/36* (2013.01); *H01L 23/3675* (2013.01);
(Continued)

(58) Field of Classification Search
CPC ............. H01L 23/3733; H01L 23/3677; H01L 23/3675
See application file for complete search history.

(56) References Cited

U.S. PATENT DOCUMENTS 7,220,365 B2 * 5/2007 Qu ........................... C09K 5/14
252/70
8,007,897 B2 * 8/2011 Ito ....................... H01L 23/3737
361/712
(Continued)

FOREIGN PATENT DOCUMENTS

EP 3331009 A1 * 6/2018 ............. H01L 23/36
JP 2006-210597 A 8/2006
(Continued)

OTHER PUBLICATIONS

International Search Report (PCT/ISA/210) issued in PCT Application No. PCT/JP2016/070362 dated Oct. 4, 2016 with English-language translation (Four (4) pages).
(Continued)

*Primary Examiner* — Laura Menz
(74) *Attorney, Agent, or Firm* — Crowell & Moring LLP

(57) ABSTRACT

An object of the present invention is to provide a power module capable of realizing a superior heat radiation property while satisfying a high insulation property. A power module according to the present invention includes: a conductor plate to which a switching element is connected; a heat radiation plate which is disposed to face the conductor plate; an insulating member which is disposed between the conductor plate and the heat radiation plate; and a conductive intermediate conductor which is disposed in the insulating member in a state of being electrically insulated from the conductor plate and the heat radiation plate, wherein the intermediate conductor has a communication region which communicates between the insulating member disposed on
(Continued)

the side of the conductor plate with respect to the intermediate conductor and the insulating member disposed on the side of the heat radiation plate with respect to the intermediate conductor.

7 Claims, 26 Drawing Sheets

(51) Int. Cl.
    *H01L 23/36*     (2006.01)
    *H01L 25/07*     (2006.01)
    *H01L 25/18*     (2006.01)
    *H01L 23/367*     (2006.01)
    *H01L 23/00*     (2006.01)

(52) U.S. Cl.
    CPC .......... *H01L 23/3677* (2013.01); *H01L 25/07* (2013.01); *H01L 25/18* (2013.01); *H01L 24/73* (2013.01); *H01L 2224/33* (2013.01); *H01L 2224/37599* (2013.01); *H01L 2224/40* (2013.01); *H01L 2224/48091* (2013.01); *H01L 2224/73265* (2013.01); *H01L 2924/00014* (2013.01); *H01L 2924/1203* (2013.01); *H01L 2924/13055* (2013.01); *H01L 2924/181* (2013.01); *H01L 2924/19107* (2013.01)

(56) References Cited

U.S. PATENT DOCUMENTS

| | | | | |
|---|---|---|---|---|
| 9,520,344 | B2 * | 12/2016 | Yamashita | ........ H01L 23/49575 |
| 9,635,762 | B2 * | 4/2017 | Watanabe | ............ H05K 1/0209 |
| 9,999,150 | B2 * | 6/2018 | Maeda | ................. H05K 7/1432 |
| 2009/0229864 | A1 * | 9/2009 | Kuromitsu | .......... H01L 23/3735 |
| | | | | 174/252 |
| 2010/0277872 | A1 | 11/2010 | Ito et al. | |
| 2015/0115423 | A1 * | 4/2015 | Yamashita | ........ H01L 23/49575 |
| | | | | 257/675 |
| 2015/0305188 | A1 * | 10/2015 | Maeda | ................. H05K 7/1432 |
| | | | | 361/728 |
| 2018/0218963 | A1 * | 8/2018 | Hojo | .................... H01L 23/3733 |

FOREIGN PATENT DOCUMENTS

| | | | | | |
|---|---|---|---|---|---|
| JP | | 2006210597 A | * | 8/2006 | ......... H01L 23/3737 |
| JP | | 2009-158919 A | | 7/2009 | |
| JP | | 2012-244750 A | | 12/2012 | |
| JP | | 2015-5570 A | | 1/2015 | |
| JP | WO | 2017022414 A1 | * | 2/2017 | ............. H01L 23/36 |
| WO | WO | 2016/038955 A1 | | 3/2016 | |

OTHER PUBLICATIONS

Japanese-language Written Opinion (PCT/ISA/237) issued in PCT Application No. PCT/JP2016/0070362 dated Oct. 4, 2016 (Five (5) pages).

* cited by examiner

FIG. 12C
FIG. 12D
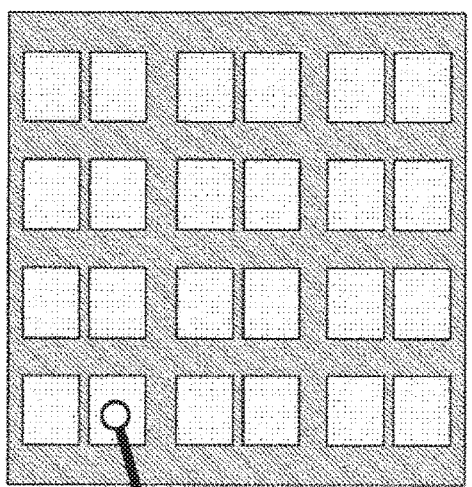
FIG. 12E
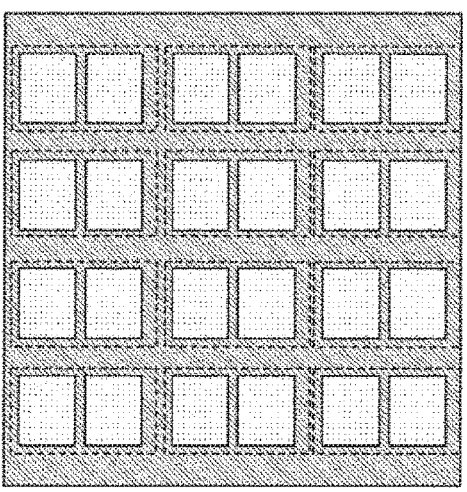
FIG. 12A
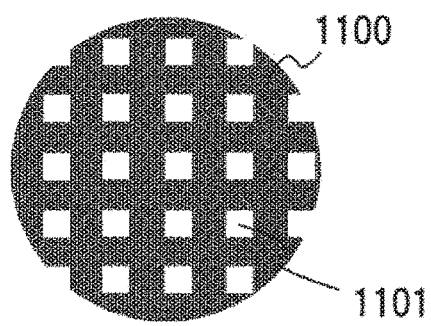
1100
1101
FIG. 12B
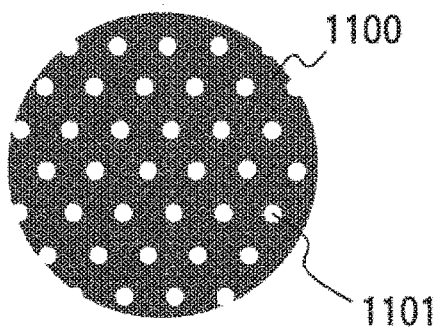
1100
1101
FIG. 12F
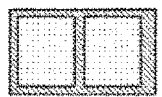

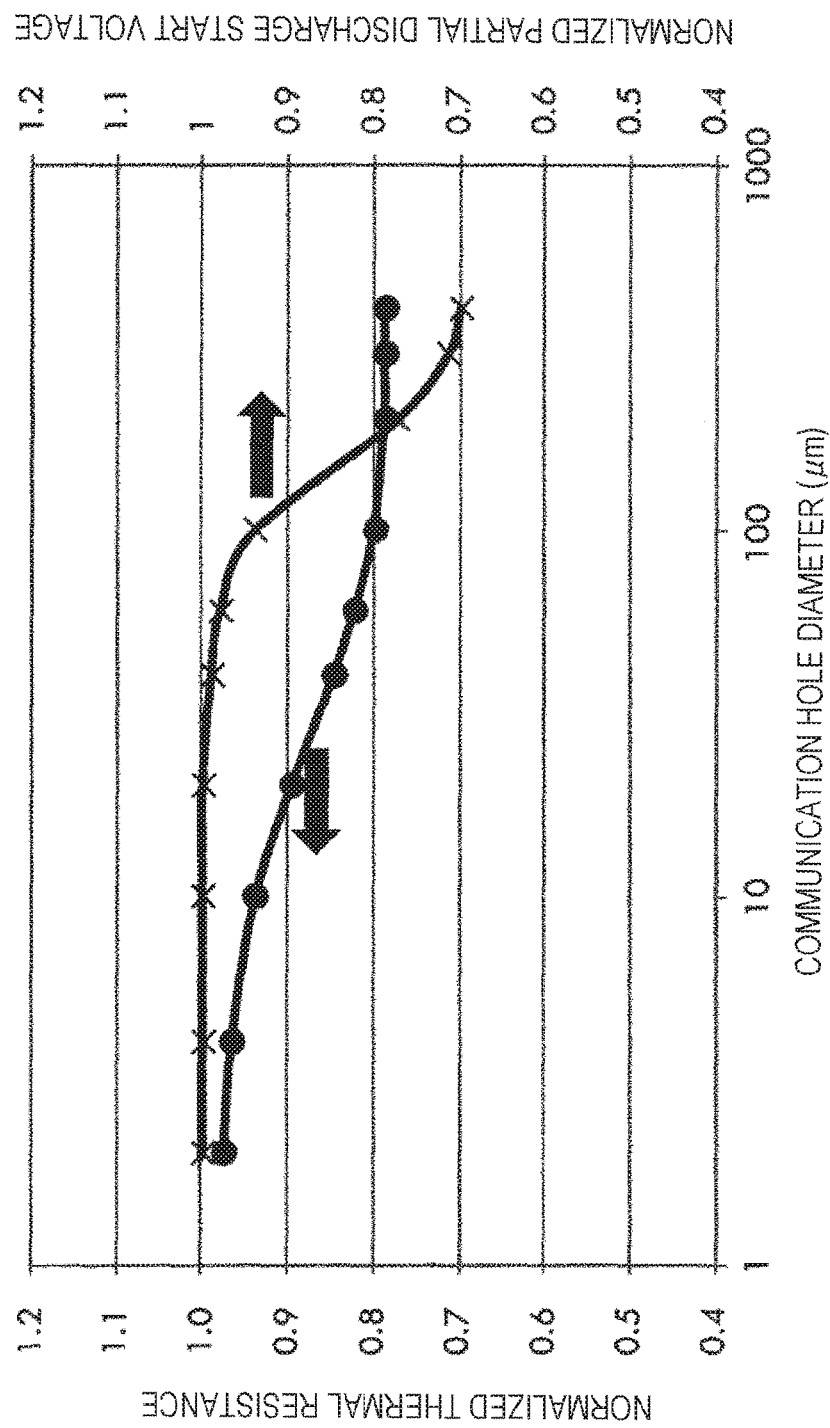

ures.

POWER MODULE

TECHNICAL FIELD

The present invention relates to a power module in which a power semiconductor element is modularized and particularly, to a power module for mounting on a vehicle.

BACKGROUND ART

A power conversion device based on switching of a power semiconductor element is widely used for consumers, vehicles, railroads, and transformer facilities, because the power conversion device has high conversion efficiency. Because the power semiconductor element generates heat by energization, a high heat radiation property is required. Generally, a metal heat radiation structure having fins is used in the heat radiation and the heat radiation structure is connected to a ground (GND) to stabilize a potential and prevent electric shock. For this reason, an insulating material disposed between the power semiconductor element and the heat radiation structure needs to have superior thermal conductivity. However, when a voltage to be converted is high, it is necessary to increase a thickness of the insulating material to improve an insulation property, so that a heat radiation property is deteriorated.

As an example of a method of improving the heat radiation property, a method of sandwiching a conductor to be a material with high thermal conductivity between insulating layers, which is disclosed in PTL 1, is known.

CITATION LIST

Patent Literature

PTL 1: JP 2012-244750 A

SUMMARY OF INVENTION

Technical Problem

In a power module described in PTL 1, a heat radiation property can be improved by providing a metal plate between a first insulating material and a second insulating material. However, a total thickness of an insulating material including the first insulating material and the second insulating material cannot be reduced.

An object of the present invention is to provide a power module capable of realizing a superior heat radiation property while satisfying a high insulation property.

Solution to Problem

A power module according to the present invention includes: a conductor plate to which a switching element is connected; a heat radiation plate which is disposed to face the conductor plate; an insulating member which is disposed between the conductor plate and the heat radiation plate; and a conductive intermediate conductor which is disposed in the insulating member in a state of being electrically insulated from the conductor plate and the heat radiation plate, wherein the intermediate conductor has a communication region which communicates between the insulating member disposed on the side of the conductor plate with respect to the intermediate conductor and the insulating member disposed on the side of the heat radiation plate with respect to the intermediate conductor.

Advantageous Effects of Invention

According to the present invention, a total thickness of an insulating layer can be reduced and a heat radiation property of a power module can be improved. Therefore, a power conversion device can be miniaturized.

BRIEF DESCRIPTION OF DRAWINGS

FIGS. 12A to 12F show a method of manufacturing an insulating layer having an intermediate conductor having a penetration region.

FIG. 13 shows a relation of an effect of reducing thermal resistance with respect to a communication hole diameter and a partial discharge start voltage.

DESCRIPTION OF EMBODIMENTS

Figure 1:
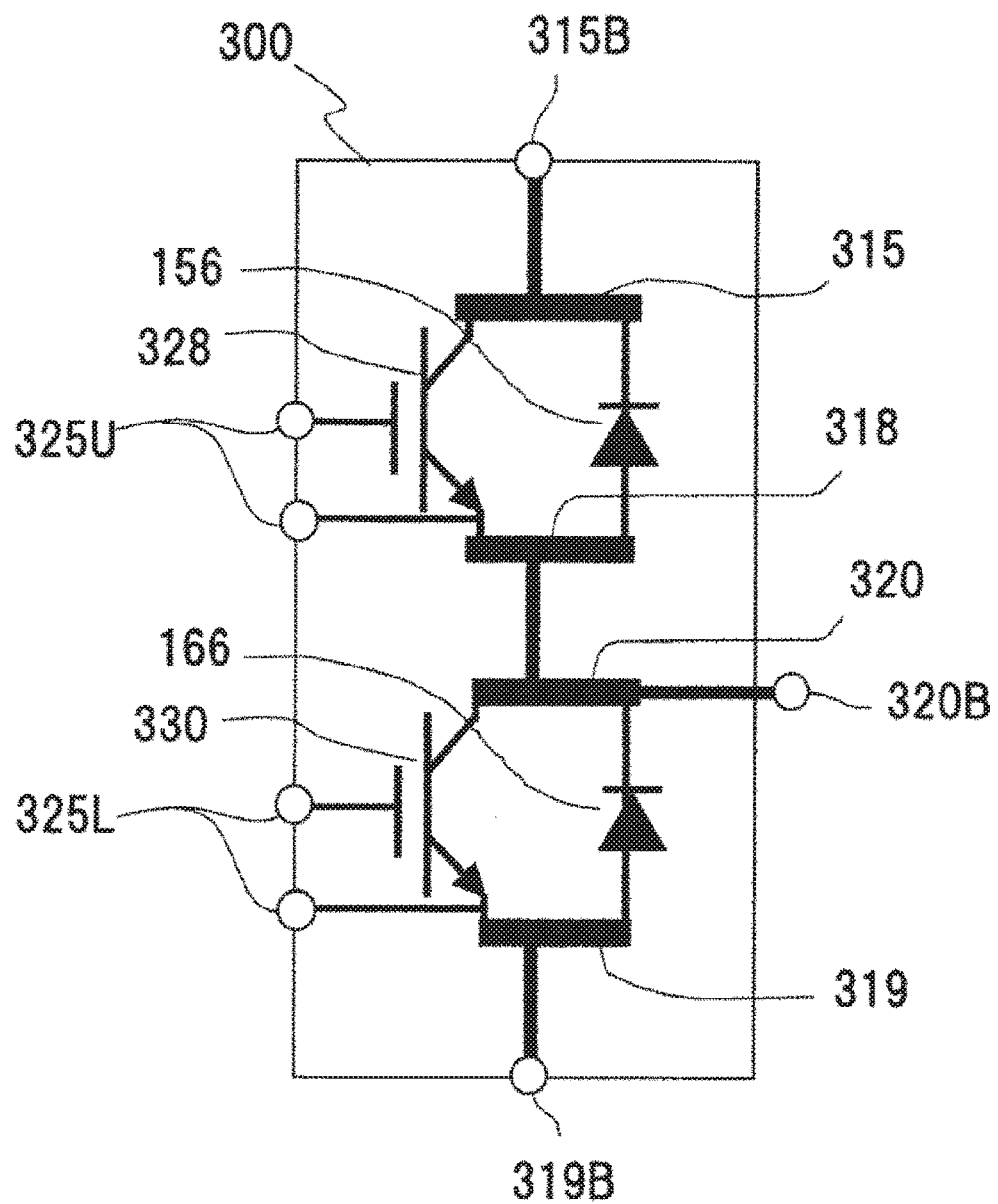
FIG. 1 is a circuit diagram of a power module according to a first embodiment.

Hereinafter, embodiments of a power module according to the present invention will be described with reference to the drawings. In the individual drawings, the same elements are denoted by the same reference numerals and redundant description is omitted.

First, a configuration of a power module according to a first embodiment will be described using FIGS. 1 to 3.

FIG. 1 is a circuit configuration diagram of a power module 300 according to this embodiment. The power module 300 includes an IGBT 328 and a diode 156 configuring an upper arm circuit and an IGBT 330 and a diode 166 configuring a lower arm circuit. Here, the IGBT is an abbreviation for an insulated gate bipolar transistor. A circuit which is connected to a positive electrode side of a battery and generates an AC waveform by switching of a power semiconductor element is the upper arm circuit and a circuit which is connected to a negative electrode side of the battery or a GND side and generates an AC waveform is the lower arm circuit. When neutral grounding is performed, the lower arm circuit is connected not to a GND but to a negative electrode side of a capacitor.

The power module 300 includes conductor plates 315, 318, 320, and 319. The conductor plate 315 is connected to a collector side of the IGBT 328 of the upper arm side. The conductor plate 318 is connected to an emitter side of the IGBT 328 of the upper arm side. The conductor plate 320 is connected to a collector side of the IGBT 330 of the lower arm side. The conductor plate conductor plate 319 is connected to an emitter side of the IGBT 330 of the lower arm side.

The power module 300 includes terminals 315B, 319B, 320B, 325U, and 325L. The terminal 315B is connected to the conductor plate 315. The terminal 315B is connected to a positive electrode side of a DC battery or a smoothing capacitor. The terminal 319B is connected to the conductor plate 319. The terminal 319B is connected to a negative pole side of the DC battery or the smoothing capacitor or the ground (GND). The terminal 320B is connected to the conductor plate 320. The terminal 320B is connected to a motor. The terminal 325U is a control terminal of the IGBT 328 of the upper arm side. The terminal 325L is a control terminal of the IGBT 325 of the lower arm side.

The conductor plate 315 connected to the terminal 315B transmits a direct current. The conductor plate 319 connected to the terminal 319B transmits a direct current. The conductor plate 320 connected to the terminal 320B transmits an alternating current.

Figure 2:
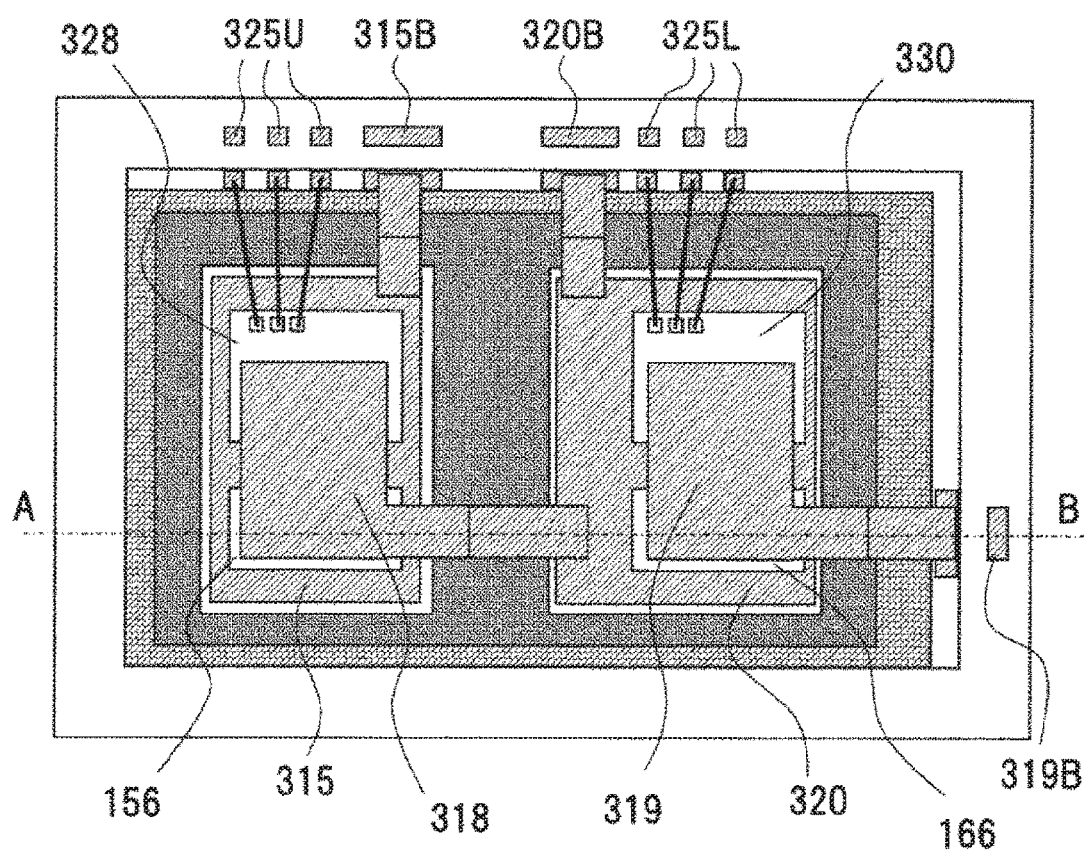
FIG. 2 is a plan view of the power module according to the first embodiment.

FIG. 2 is a plan view showing a structure of the power module 300 according to this embodiment. The IBGT 328 and the IGBT 330 are disposed such that emitter surfaces thereof are oriented in the same direction.

Figure 3:
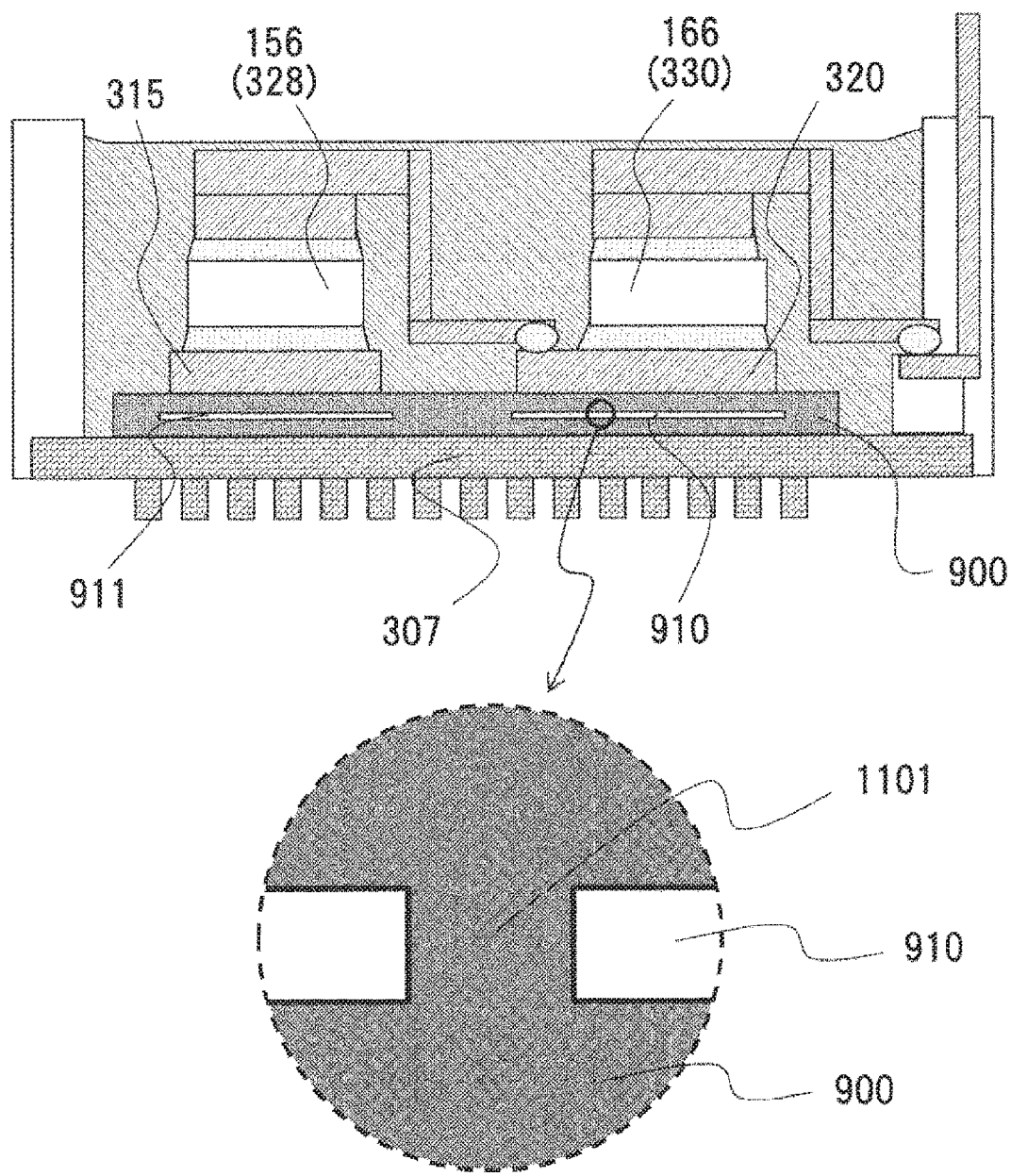
FIG. 3 is a cross-sectional view of the power module of FIG. 2 taken along the line A-B.

FIG. 3 is a cross-sectional view of the power module 300 of FIG. 2 taken along the line A-B. The power module 300 has a heat radiation surface 307 on which fins for heat radiation are formed. The heat radiation surface 307 is disposed on the side opposite to the IGBTs 328 and 330 and the diodes 156 and 166 with the conductor plate 320 and the conductor plate 315 therebetween. The heat radiation surface 307 is formed of a conductive member and is connected to the GND for voltage stabilization.

In addition, the power module 300 has an intermediate conductor 910 and an intermediate conductor 911. The intermediate conductor 910 is disposed between the conductor plate 320 and the heat radiation surface 307. The intermediate conductor 911 is disposed between the conductor plate 315 and the heat radiation surface 307. An insulating layer 900 is formed between the intermediate conductor 910 and the conductor plate 320, between the intermediate conductor 910 and the heat radiation surface 307, between the intermediate conductor 911 and the conductor plate 315, and between the intermediate conductor 911 and the heat radiation surface 307. One of characteristic parts in this embodiment is that a communication region 1101 is formed with respect to any one of the intermediate conductors 910 and 911 or both the intermediate conductors 910 and 911, as shown in a partially enlarged view of FIG. 3. A configuration of the communication region will be described later.

In the power module according to this embodiment, when projected along an arrangement direction of the conductor plate 320 and the intermediate conductor 910, the intermediate conductor 910 is formed such that a projection portion of the conductor plate 320 includes a projection portion of the intermediate conductor 910. In addition, when projected along an arrangement direction of the conductor plate 315 and the intermediate conductor 911, the intermediate conductor 911 is formed such that a projection portion of the conductor plate 319 includes a projection portion of the intermediate conductor 911.

As in the power module according to this embodiment, a structure in which two arm circuits of the upper arm circuit and the lower arm circuit are integrally modularized is called a 2in1 structure. The 2in1 structure can reduce the number of output terminals as compared with a 1in1 structure in which each arm circuit is modularized. In this embodiment, an example of the 2in1 structure is shown. However, the number of terminals can be further reduced by using a 3in1 structure, a 4in1 structure, a 6in1 structure, or the like. In the power module having the 2in1 structure, the upper arm circuit and the lower arm circuit are disposed to face a metal flat plate with the insulating layer therebetween, so that inductance of the circuit can be reduced by a magnetic field offset effect.

The power module according to this embodiment is provided with the intermediate conductor 910, so that a voltage between the conductor plate 320 and the heat radiation surface 307 is shared between the conductor plate 320 and the intermediate conductor 910 and between the intermediate conductor 910 and the heat radiation surface 307. As a result, the power module according to this embodiment can reduce a thickness of the insulating layer while satisfying an insulation property. This principle will be described below using FIGS. 4 to 13.

Figure 4:
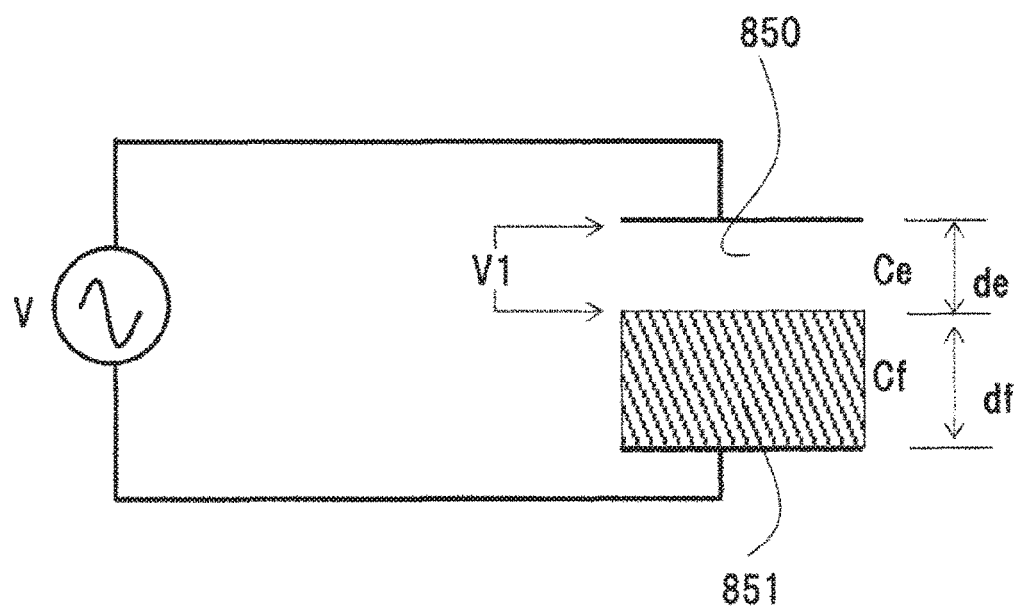
FIG. 4 shows a model of voltage sharing when there is an air layer between an insulating layer and an electrode.

FIG. 4 is a diagram showing a model of voltage sharing when there is an air layer between an insulating layer and an electrode. An air layer 850 and an insulating layer 851 are formed between the electrodes. If an AC voltage applied across the electrodes is set as V and a voltage applied to only the air layer is set as $V_1$, a voltage V is represented by the following formula. In this case, $C_e$ represents a capacity of the air layer, $C_f$ represents a capacity of the insulating layer, $\varepsilon_0$ represents permittivity of vacuum, z represents relative permittivity of the insulating layer, S represents an electrode area, $d_e$ represents a thickness of the air layer, and $d_f$ represents a thickness of the insulating layer.

$$V = V_1 \cdot (C_e + C_f)/C_f = V_1 \cdot (d_f/(\varepsilon \cdot d_e) + 1) \quad \text{(Formula 1)}$$

$$C_e = \varepsilon_0 \cdot S/d_e \quad \text{(Formula 2)}$$

$$C_f = \varepsilon_0 \cdot \varepsilon \cdot S/d_f \quad \text{(Formula 3)}$$

If the air layer is formed between the electrode and the insulating layer or inside the insulating layer due to voids or peeling, partial discharge is generated when a high voltage is applied to the electrodes. If the insulating layer is exposed to an environment where the partial discharge is generated at all times, the insulating layer is eroded by sparks due to the discharge and an endurance time remarkably decreases. Particularly, an insulator made of a resin has low heat resistance as compared with ceramics and an influence thereof becomes remarkable. To improve the insulation property, it is effective to use the insulator under a condition where the partial discharge is not generated.

In addition, a discharge phenomenon is different in a DC voltage and an AC voltage. When there is an insulating layer between the electrodes under the DC voltage, even under a condition where the partial discharge is generated, after one charge, the insulating layer is charged and an electric field of a space decreases. For this reason, the discharge is stopped. Therefore, because the voltage is discharged only once, an influence on the deterioration of the insulating layer due to the discharge is small. Meanwhile, under the AC voltage, because the voltage applied to the insulating layer is inverted over time, the discharge is repeated. For this reason, the influence on the deterioration of the insulating layer due to the discharge is large. Furthermore, when the AC waveform is generated by switching of the power semiconductor element, a surge voltage is superimposed on the AC waveform, so that a voltage higher than a rated voltage is applied to the insulating layer.

Therefore, it is important to prevent the insulating layer to which the AC voltage is applied from being exposed to an environment in which the partial discharge is generated in particular. To suppress the partial discharge, any method of a method of completely filling an insulator between the electrodes to prevent the air layer from existing between the electrodes and maintaining this state even under a use environment where a temperature changes and a method of providing a thickness of the insulating layer not to cause the partial discharge even if the air layer is generated, for example, by peeling is considered. The power module according to this embodiment adopts the latter approach.

Figure 5:
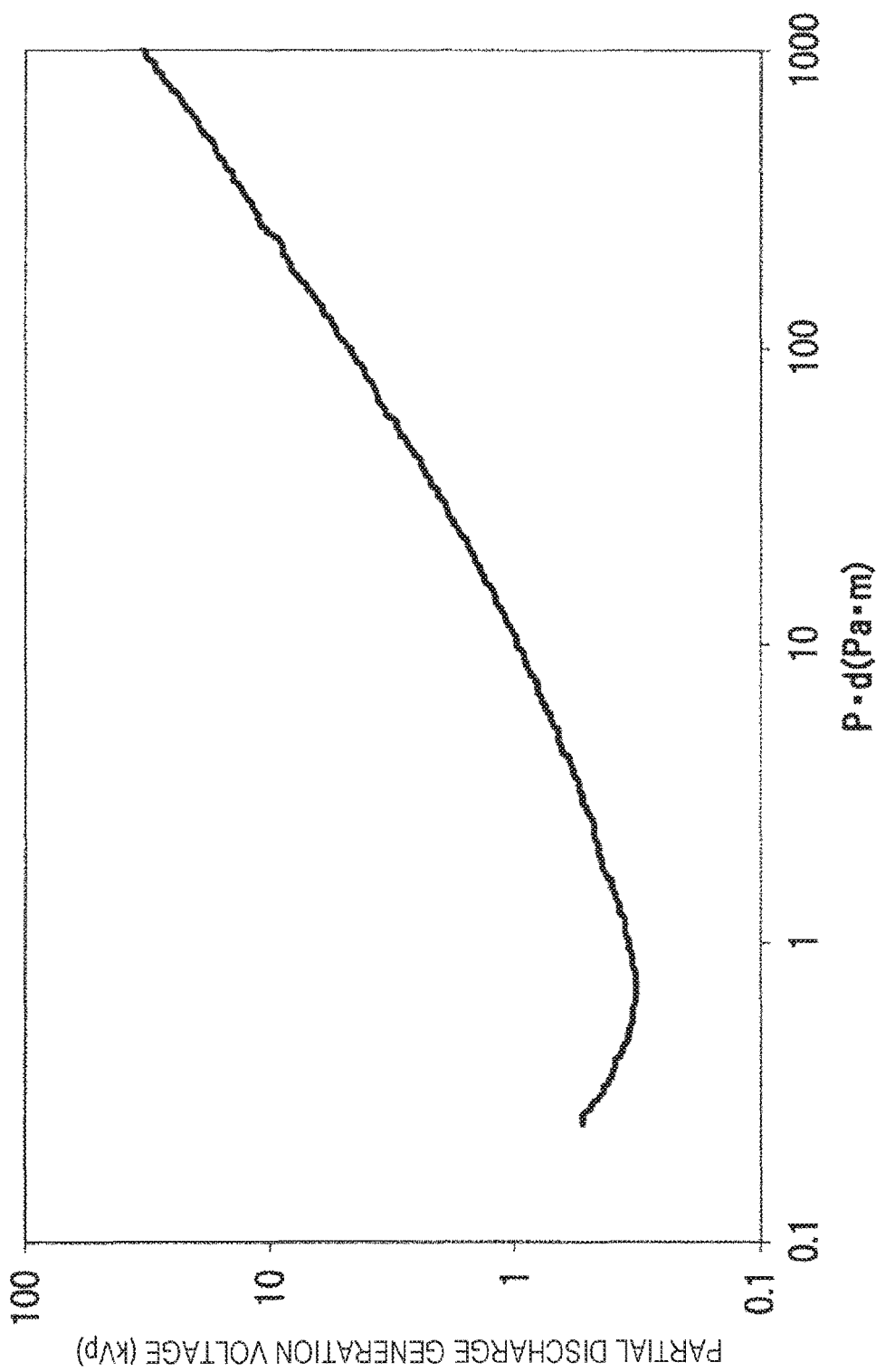
FIG. 5 shows a relation of a partial discharge generation voltage and an atmospheric pressure pinter-electrode distance d according to a Paschen's law.

A voltage where the partial discharge is generated will be described using FIG. 5. When there is an air gap between the electrodes, it is shown by Paschen that a partial discharge start voltage is shown by a relation of an atmospheric pressure and a length of the air gap between the electrodes and this is then confirmed theoretically and experimentally by many researchers. FIG. 5 is a graph showing a partial discharge generation voltage by a relation of the product of an atmospheric pressure p and an inter-electrode distance d and the partial discharge generation voltage, when a voltage is applied to the electrodes of the inter-electrode distance d at the atmospheric pressure p. FIG. 5 shows a result measured at 20° C. As shown in FIG. 5, the partial discharge generation voltage has a minimum value when the product p·d of the atmospheric pressure and the inter-electrode distance is a certain value. That is, when a voltage exceeding the voltage to be the minimum value of the partial discharge generation voltage is applied to the air gap between the electrodes, the partial discharge is generated depending on a value of the product p·d.

Because a pressure according to a Paschen's law can be converted into a particle density of gas, a partial discharge start voltage at any temperature and pressure can be obtained by using a state equation of gas. If the partial discharge start voltage obtained as described above is substituted for $V_1$ in the formula (1), the minimum value of the inter-electrode voltage V at which the discharge is generated can be calculated from the relation of the atmospheric pressure p and the thickness $d_e$ of the air layer. Graphs obtained by plotting the minimum partial discharge voltage value calculated as described above with respect to the thickness $d_f$ of the insulating layer are shown in FIGS. 6 to 8.

Figure 6:
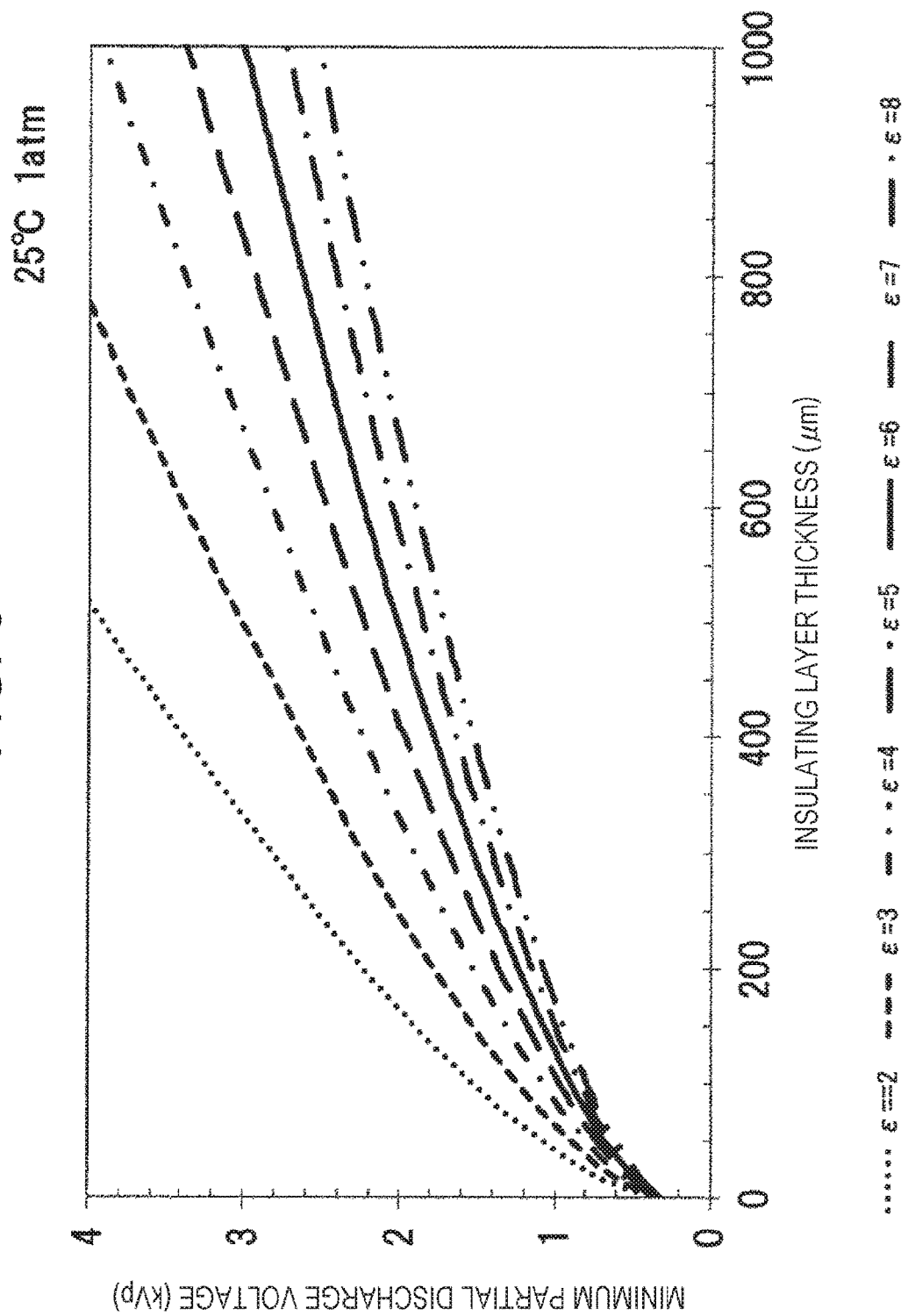
FIG. 6 shows a relation of a minimum partial discharge voltage and an insulating layer thickness.

FIG. 6 shows a relation of the minimum partial discharge voltage at 25° C. and 1 atm and the thickness $d_f$ of the insulating layer. If the thickness $d_f$ of the insulating layer increases, a voltage shared by the insulating layer 851 with respect to the voltage V increases, so that the voltage $V_1$ shared by the air layer 850 decreases. Therefore, when the thickness $d_f$ of the insulating layer increases, the minimum partial discharge start voltage increases.

Here, it should be noted that the relation of the thickness $d_f$ of the insulating layer and the minimum partial discharge voltage is not a proportional relation. That is, an inclination of the graph in a region where the thickness $d_f$ of the insulating layer is small is larger than an inclination of the graph in a region where the thickness $d_f$ of the insulating layer is large. By using this characteristic, reduction of the thickness of the insulating layer can be realized while an insulation property is secured, as described later. From FIG. 6, it can be seen that the thickness $d_f$ can be decreased when the permittivity of the insulating layer 851 is low, at the same minimum partial discharge voltage.

Figure 7:
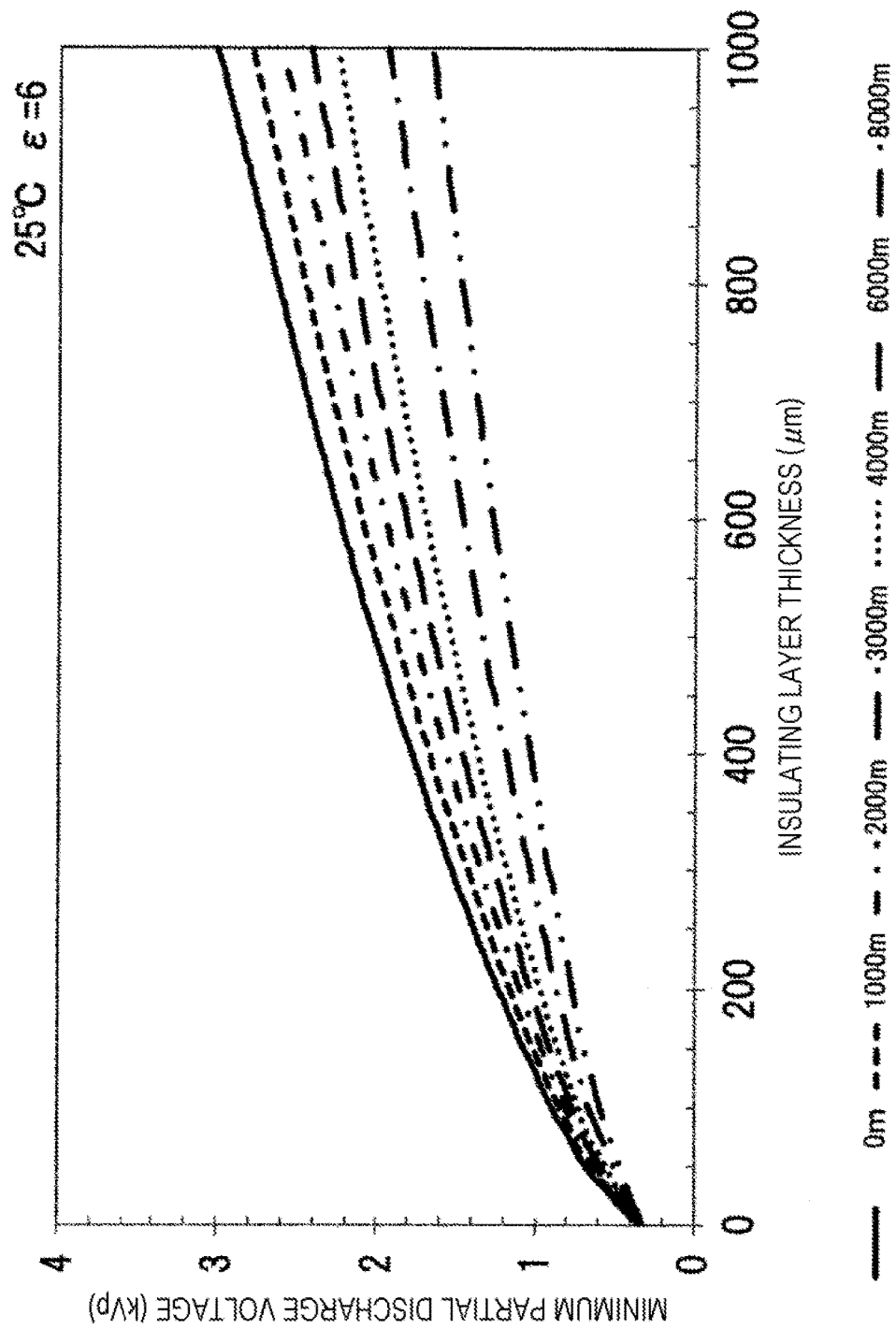
FIG. 7 shows a relation of a minimum partial discharge voltage and an insulating layer thickness considering an atmospheric pressure change due to an altitude.
Figure 8:
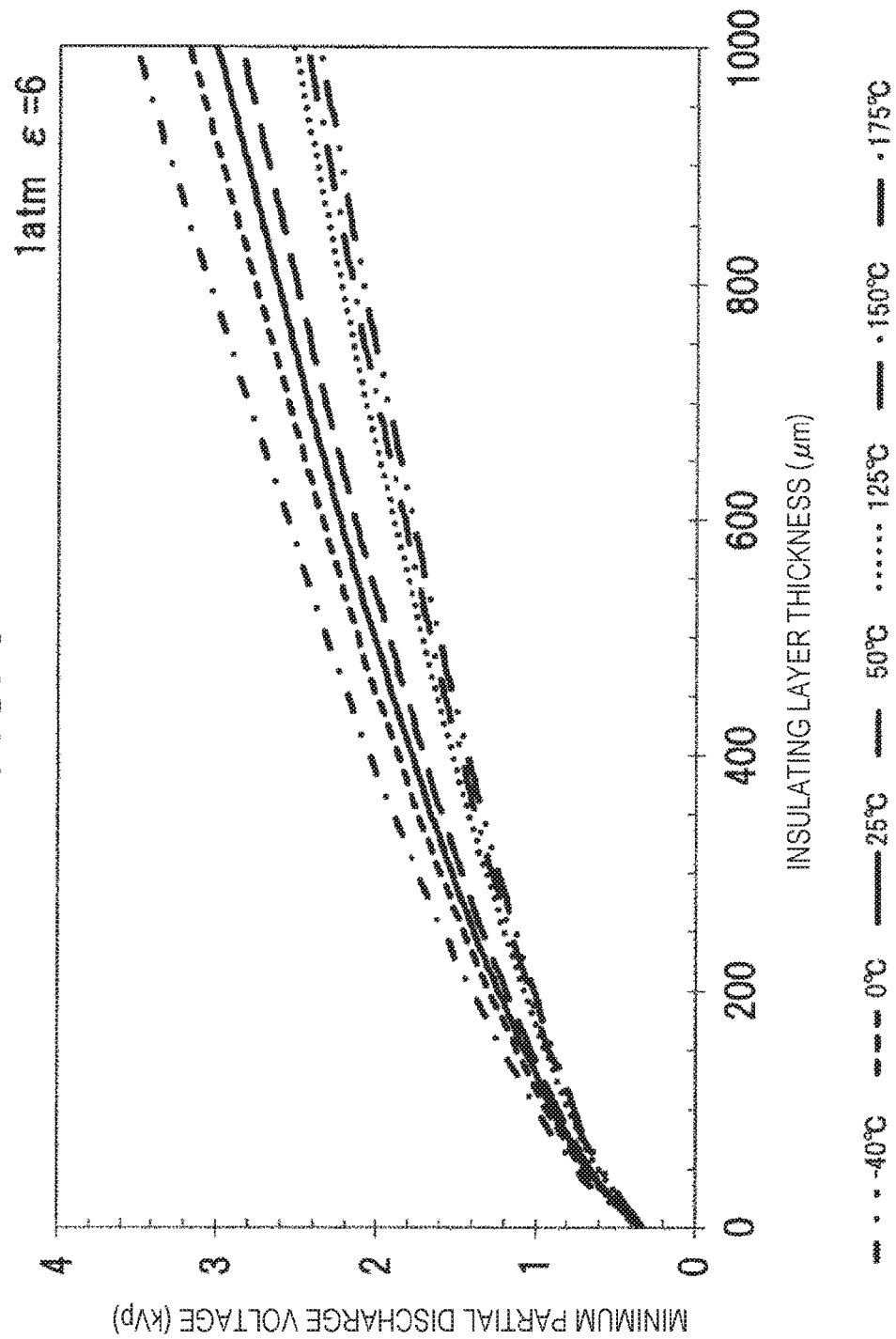
FIG. 8 shows a relation of a minimum partial discharge voltage and an insulating layer thickness considering a particle density change due to a temperature.

FIG. 7 shows a relation of the minimum partial discharge voltage at 25° C. and the relative permittivity of the insulating layer of 6 and the thickness $d_f$ of the insulating layer. From FIG. 7, it can be seen that it is necessary to increase the thickness of the insulating layer when an altitude becomes high, that is, the atmospheric pressure becomes low, to obtain the same minimum partial discharge voltage. This influence becomes noticeable from around 4000 m in particular.

FIG. 8 shows a relation of the minimum partial discharge voltage at 1 atm and the relative permittivity of the insulating layer of 6 and the thickness $d_f$ of the insulating layer. From FIG. 8, it can be seen that it is necessary to increase the thickness $d_f$ of the insulating layer when a temperature increases, to obtain the same minimum partial discharge voltage. This influence becomes noticeable from around 50° C. in particular.

Figure 9:
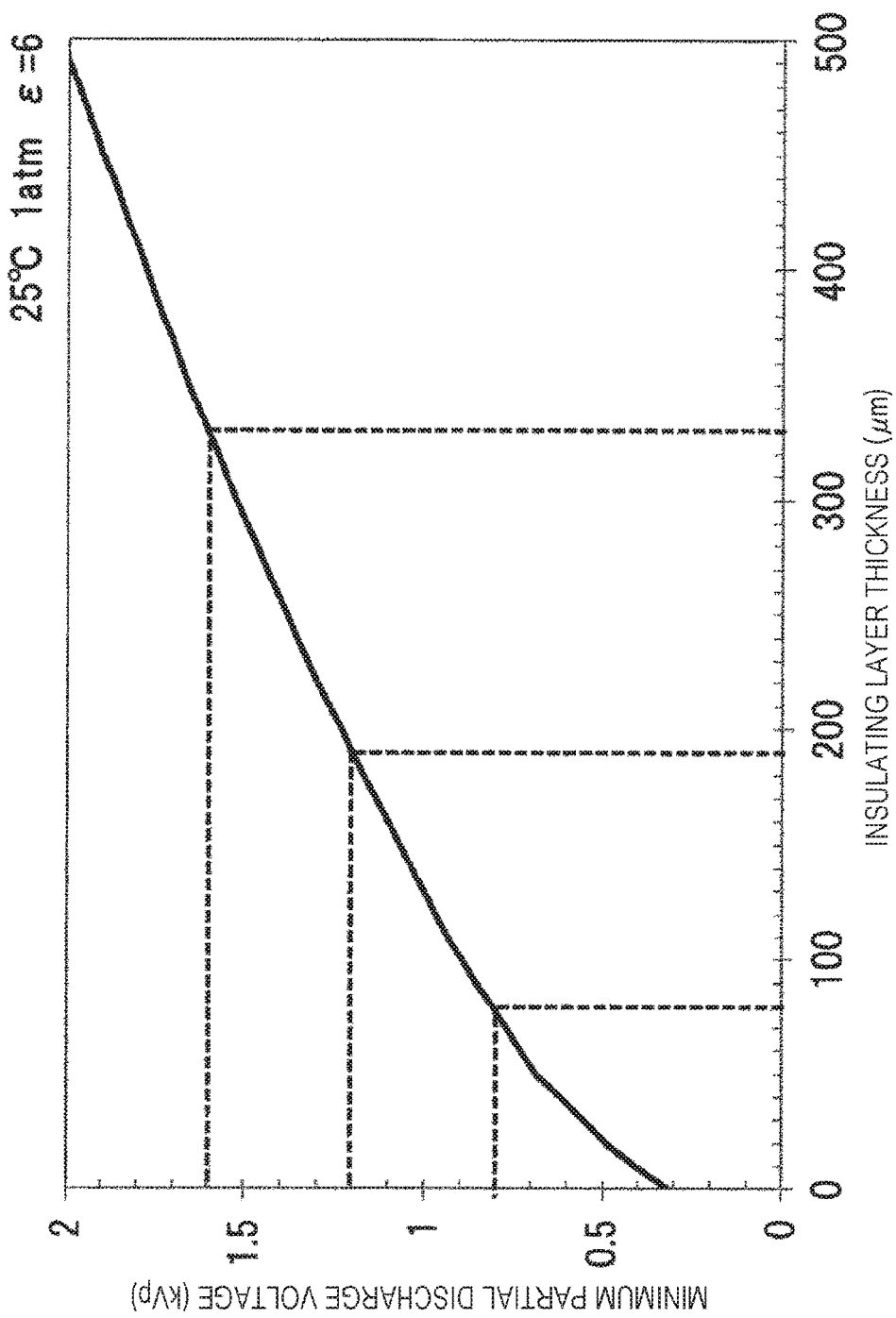
FIG. 9 shows a relation of a minimum partial discharge voltage and an insulating layer thickness.

FIG. 9 shows a relation of the minimum partial discharge voltage at 25° C., 1 atm, and the relative permittivity of 6 and the thickness $d_f$ of the insulating layer. A principal of reducing the total thickness $d_f$ of the insulating layer 851 while suppressing the partial discharge will be described using FIG. 9.

For example, the case where a voltage of a maximum of 1.6 kVp is applied between the electrodes is considered. From FIG. 9, because the minimum partial discharge voltage is 1.6 kVp when the thickness $d_f$ of the insulating layer is 330 µm, the partial discharge is not generated when the insulating layer is formed to be thicker than 330 µm even if the air gap is generated by peeling.

Meanwhile, when the voltage applied between the electrodes is 0.8 kVp, the partial discharge is not generated if the insulating layer is thicker than 80 μm. This is because, as described above, the relation of the minimum partial discharge voltage and the thickness $d_f$ of the insulating layer is not the proportional relation, the inclination is large in the region where the thickness $d_f$ of the insulating layer is small, and the inclination decreases when the thickness $d_f$ of the insulating layer increases.

Therefore, even if the voltage is 1.6 kVp, the discharge can be suppressed by dividing the voltage into two parts of 0.8 kVp and 0.8 kVp and providing insulating layers thicker than 80 μm. As a result, the total thickness of the insulating layer requiring 330 μm in only one layer can be reduced to 160 μm. Here, although an example of two layers is shown, it is obvious that the thickness can be further reduced by configuring three or more layers. If the thickness of the insulating layer can be reduced, the thermal resistance is reduced by that amount, so that the heat radiation property is improved. Further, if the thickness of the insulating layer is reduced, a material cost can be advantageously reduced. Therefore, a model of a structure for dividing the voltage applied to the insulating layer of the power module will be described below using FIGS. 10 to 13.

Figure 10:
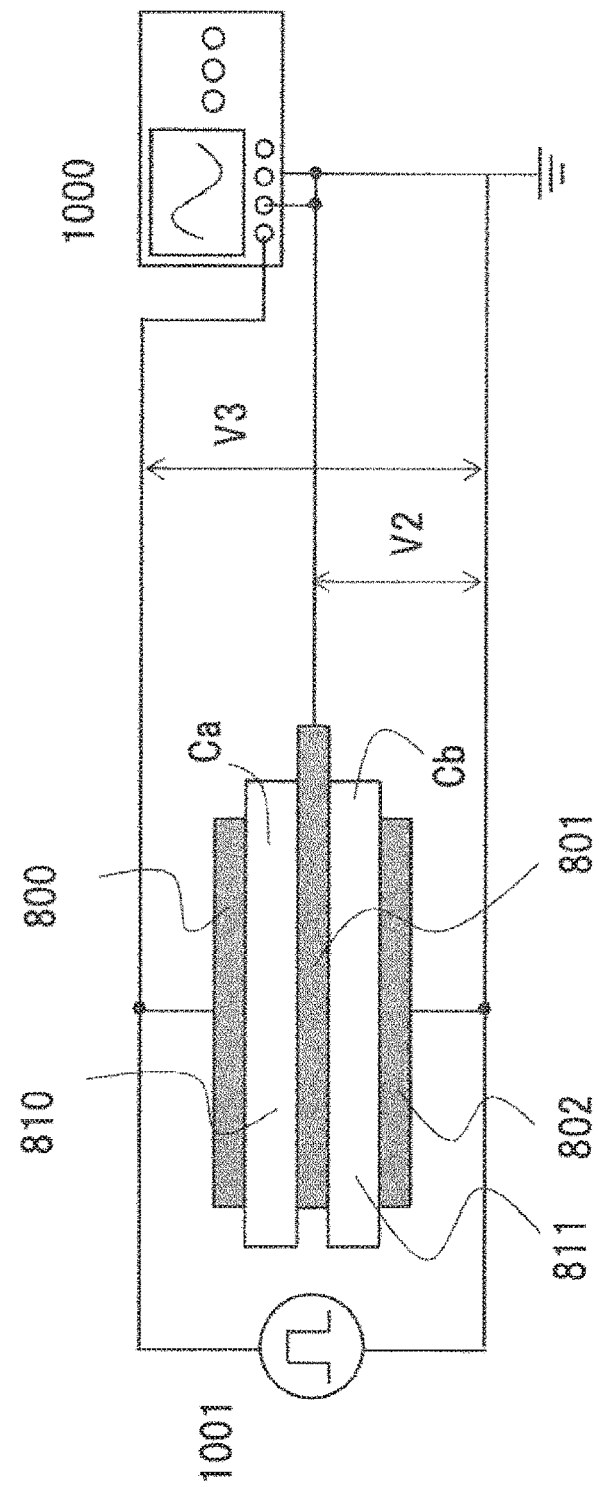
FIG. 10 is a schematic diagram of an experimental system including an insulating layer portion to which an AC voltage of the power module is applied.

FIG. 10 is a schematic diagram of an experimental system in which an AC voltage is applied to an insulating layer portion having an intermediate conductor. As described above, in the power module of FIG. 3, a direct current flows through the conductor plate 319, but an alternating current flows through the conductor plate 320. FIG. 10 shows a voltage sharing model in the insulating layer of the power module to which the AC voltage is applied. An electrode 800 of FIG. 10 corresponds to the conductor plate 320 of FIG. 3, an intermediate conductor 801 of FIG. 10 corresponds to the intermediate conductor 910 of FIG. 3, an electrode 802 of FIG. 10 corresponds to the heat radiation surface 307 of FIG. 3, and insulating layers 810 and 811 of FIG. 10 correspond to the insulating layer 900 of FIG. 3.

The electrodes 800 and 801 are connected to a transmitter 1001. The intermediate conductor 801 is disposed between the electrode 800 and the electrode 801. The insulating layer 810 is disposed between the electrode 800 and the intermediate conductor 801. The insulating layer 811 is disposed between the electrode 802 and the intermediate conductor 801. The electrode 802 is connected to the GND. If a voltage between the intermediate conductor 801 and the electrode 802 is set as $V_2$ and a voltage between the electrode 800 and the electrode 802 is set as $V_3$, voltage sharing of a capacity circuit when the AC voltage is applied can be calculated by the following formula.

$$V_2 = V_3 \cdot C_a/(C_a+C_b) \quad \text{(Formula 4)}$$

$$C_a = \varepsilon_0 \cdot \varepsilon_a \cdot S_a/d_a \quad \text{(Formula 5)}$$

$$C_b = \varepsilon_0 \cdot \varepsilon_b \cdot S_b/d_b \quad \text{(Formula 6)}$$

In this case, $C_a$ represents a capacity between the electrode 800 and the intermediate conductor 801, $C_b$ represents a capacity between the intermediate conductor 801 and the electrode 802, $\varepsilon_0$ represents permittivity of vacuum, $\varepsilon_a$ represents relative permittivity of the insulating layer 810, $\varepsilon_b$ represents relative permittivity of the insulating layer 811, $S_a$ represents an overlapping area of projection surfaces in an arrangement direction of the electrode 800 and the intermediate conductor 801, $S_b$ represents an overlapping area of projection surfaces in an arrangement direction of the intermediate conductor 801 and the electrode 802, $d_a$ represents a thickness of the insulating layer 810, and $d_b$ represents a thickness of the insulating layer 811.

Here, the structure of the voltage sharing model and the material of the insulating layer are adjusted and $\varepsilon_a = \varepsilon_b$, $d_a = d_b$, and $S_a = S_b$ are set, so that $C_a = C_b$ is realized. At this time, from the formula (4), a voltage sharing ratio obtained by dividing $V_2$ by $V_3$ becomes 50%. In this model, Ca=Cb is realized.

$$V_2/V_3 = 50\% \quad \text{(Formula 7)}$$

Figure 11:
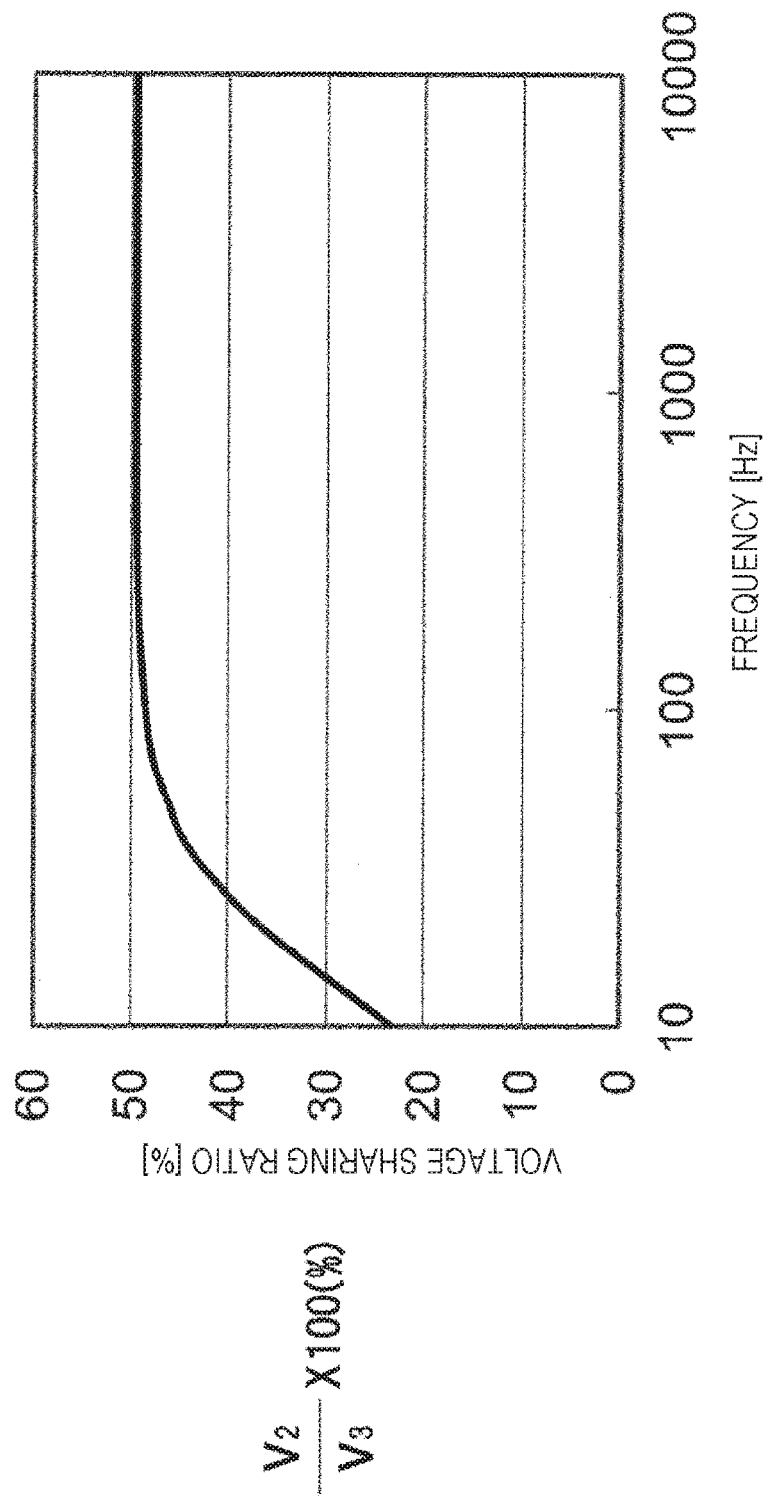
FIG. 11 shows a relation of a voltage sharing ratio and a frequency.

FIG. 11 is a graph showing the voltage sharing ratio $V_2/V_3$ when a frequency of the transmitter 1001 of FIG. 10 is changed. The voltage sharing ratio is obtained by measuring the voltage $V_1$ between the intermediate conductor 801 and the electrode 802 and the voltage $V_2$ between the electrode 800 and the electrode 802 by a curve tracer 1000.

From FIG. 11, when a frequency of the voltage applied between the electrode 800 and the electrode 802 increases, the voltage sharing ratio tends to approach 50%. The voltage sharing ratio becomes approximately 50% when the frequency exceeds 100 Hz. This tendency is the same for a sine wave and a rectangular wave.

From the results of this model, it can be seen that the intermediate conductor is provided in the insulating layers between the electrodes to which an AC voltage of 100 Hz or more is applied, so that it is possible to share the voltage applied to the insulating layers according to the capacity.

Here, a current is output from the intermediate conductor 801 for model evaluation. However, in an actual power module, it is not necessary to extract the current from the intermediate conductor. Therefore, the intermediate conductor can be buried in the insulating layers. If the intermediate conductor is buried in the insulating layers, an end face of the intermediate conductor can be prevented from coming close to the electrode and the discharge from the end face can be prevented.

In the case in which the intermediate conductor is buried in the insulating layers, if the insulating layers of the same material are used for the layers on and below the intermediate conductor and an external dimension of the intermediate conductor is matched to a size of any facing electrode, the capacities of both sides of the intermediate conductor can be equalized even when the size is different from a size of the other electrode. In this case, because it is substantially difficult to perfectly match the sizes, it is preferable that the intermediate conductor is slightly larger than the electrode of the smaller area side, in consideration of alignment or dimensional tolerance. This is because, when the intermediate conductor is smaller, a portion where the voltage is not shared is generated and the partial discharge may be generated by peeling. The power module according to this embodiment has the intermediate conductors 910 and 911 that have areas slightly larger than areas of the conductor plates 320 and 315.

The intermediate conductor 910 of the DC side is not restricted to the size of the conductor plate 315 due to the reasons to be described later and may be larger or smaller than the conductor plate. Also, it can be omitted.

FIGS. 12A and 12B are diagrams showing a procedure for manufacturing the insulating layer having the intermediate conductor. However, the procedure shown in FIGS. 12A and 12B is an example and the manufacturing procedure may not be the following method. 12C An insulating sheet is prepared. 12D An aluminum film conductor pattern with a thickness of 0.1 μm is formed on the insulating sheet with aluminum vapor deposition through masking in which a conductor having a pattern of mesh-like communication holes having a hole diameter (length of a diagonal line of a hole configuring a mesh) of 10 μm is formed in an intermediate conductor formation portion. An insulating sheet not patterned is pressed such that an aluminum film formed by the vapor deposition becomes an inner portion. Here, an example of the aluminum film is shown. However, if a conductive material is used, the material is not particularly limited. In addition, an example of the vapor deposition is shown. However, any forming method using masking may be used and a method such as transferring, vapor deposition, printing, and plating may be used. 12E A punching position with a die is set. 12F The insulating sheet having the intermediate conductor internally is punched with the die. By manufacturing the insulating layer in this way, the thin intermediate conductor can be formed. By forming the insulating sheet having a thin intermediate conductor layer, it is possible to reduce occurrence of non-uniformity of a crimping pressure due to a step of the intermediate conductor when the insulating sheet is crimped and it is possible to form a uniform crimping surface.

As described above, the power module according to this embodiment is characterized in that the intermediate conductor has the pattern of the mesh-like communication holes. This characterizing portion will be described in detail below.

The power module is formed by crimping an insulating member made of a resin and the conductor plate and the heat radiation plate. The insulating member used for the insulating member flows to the conductor plate and unevenness of the heat radiation plate surface due to a heat and a pressure at the time of crimping and is cured, so that adhesion between the resinous insulating member and the conductor plate and the heat radiation plate is formed. At this time, when an amount of resin used for forming the insulating member is large, conformity to the conductor plate and the unevenness of the heat radiation plate surface is good and adhesiveness is good. For example, in the case in which a resin sheet is used for the insulating member, when a thickness of the resin sheet is larger, the adhesiveness becomes superior. This is remarkable when a module is formed using a resin sheet containing fillers in the resin. That is, an amount of resin contained in the resin sheet is decreased by the contained fillers and the fluidity at the time of crimping decreases due to a viscosity increase by containing of the fillers. Therefore, it is effective to increase the amount of resin flowing by using a thicker sheet.

However, in the case in which the intermediate conductor is included in the insulating member and a voltage applied to the insulating layer is shared, when an intermediate conductor (for example, a metal foil) not having a communication region is used, flowing of a resin material or a resin/filler composite material used for the insulating member is hindered by the intermediate conductor. For example, in the case in which one intermediate conductor layer is provided at a center in the insulating member, the fluidity of the resin or the resin/filler in the insulating member may decrease to the same extent as the fluidity of the resin or resin/filler of the insulating member having the thickness of ½. For this reason, the adhesiveness between the insulating member and the conductor plate and the heat radiation plate decreases and the thermal resistance increases.

Meanwhile, as in this embodiment, when the intermediate conductor having the communication region is used, the resin or the resin/filler can flow through the communication region and as compared with the intermediate conductor not having the communication region, the adhesiveness between the insulating member and the conductor plate and the heat radiation plate is improved and the thermal resistance decreases.

In addition, when the filler-containing resin sheet and the intermediate conductor not having the communication region are used, the resin and the fillers cannot pass through the intermediate conductor. For this reason, the fillers contact a metal surface to be the intermediate conductor and adhere to the metal surface by the resin. To increase thermal conductivity of the resin sheet, it is effective for the fillers to form a continuous structure in the resin sheet. If the continuous structure of the fillers is hindered by the intermediate conductor, this causes the thermal conductivity of the resin sheet to decrease.

Meanwhile, in this embodiment, because the intermediate conductor has the communication region, the continuous structure of the fillers is formed without being blocked. As a result, the thermal conductivity of the resin sheet can be decreased as compared with the case of using the intermediate conductor not having the communication region.

In addition, when a liquid crystalline resin having a regular structure is used as the resin, the regular structure is generally easy to form on surfaces of the fillers and is formed between the fillers or designed to be formed between the fillers. It may be difficult to form the regular structure on a surface of the metal foil or even if the regular structure is formed, a direction of the regular structure may be different. In this case, the regular structure of the resin is disturbed on the surface of the metal foil and the thermal conductivity of the resin on the surface of the metal foil is lower than the thermal conductivity of the resin between the fillers.

Meanwhile, in this embodiment, because the intermediate conductor having the communication region is used, the filler and the resin have the continuous structure via the communication region. Therefore, the disturbance in the regular structure on the surface of the metal foil can be suppressed and a decrease in the thermal conductivity of the resin can be reduced. A slight difference in the thermal conductivity of the resin to be a matrix greatly affects the thermal conductivity of the filler-containing resin sheet to be a composite. In addition, in the case of a composite material highly filled with the fillers, a change in the thermal conductivity of the resin to be the matrix greatly affects the thermal conductivity of the composite material. Therefore, when the resin sheet including the resin having the regular structure and the fillers is used, it is effective to use the intermediate conductor having the communication hole to reduce a decrease in the thermal conductivity of the resin sheet by the intermediate conductor.

The shape of the communication hole of the intermediate conductor formed to form the communication region is not particularly limited. As examples, FIGS. 12(a) and 12(b) are shown. However, the shape of the communication hole viewed from a plan view of the intermediate conductor may be a circular shape, a square shape, an elliptical shape, a rectangular shape, a mesh shape, or the like. In addition, communication holes having different shapes may be included. It is desirable that a plurality of communication holes are uniformly disposed in the intermediate conductor. In addition, the communication holes may be disposed intensively in a place where the decrease in the heat conductivity is large.

Further, a large number of conductors having shapes such as particles, scales, slices, and flat plates can be connected to form a layer having a continuous structure of the conductors and communication holes can be provided in the layer having the continuous structure of the conductors to form the intermediate conductor. The communication holes formed in the intermediate conductor may be connection holes in which the resin and the filler can flow through a hole passage and the hole passage may be straight forward or bent in the intermediate conductor.

As a size of the communication hole, a hole diameter of the communication hole is preferably 300 µm or less. Here, the hole diameter refers to a length of a most distant place in a shape of a hole forming the communication hole. If the size of the communication hole is 300 µm or more, the fluidity of the resin and the filler is improved and the thermal resistance can be decreased. However, because an effect of voltage sharing by the intermediate conductor decreases or disappears, the partial discharge is easily generated. Therefore, the hole diameter of the communication hole is preferably 300 µm or less. However, the hole diameter of the communication hole is more preferably 100 µm or less, because the effect of voltage sharing by the intermediate conductor does not disappear.

The resin or the resin and the filler flow through the communication hole of the intermediate conductor, so that the thermal resistance can be reduced as compared with the intermediate conductor not having the communication hole. Therefore, the hole diameter of the communication hole may be at least a hole diameter where the resin can flow and is preferably a hole diameter where the resin and the filler can flow. If the hole diameter of the communication hole is 0.1 µm or less, the fluidity of the resin is lowered, so that the thermal resistance increases. If the hole diameter of the communication hole is a filler particle diameter or less, the fluidity of the resin and the filler is lowered, so that the thermal resistance increases. Here, one or more filler groups having constant particle size distributions are included in the resin sheet, but the particle diameter of the filler refers to an average particle diameter in a particle size distribution (number distribution) of a filler group with a smallest particle diameter among the filler groups having constant particle size distributions.

A material to form the intermediate conductor may be an electric conductor. For example, copper or aluminum can be used. As a method of forming the intermediate conductor having the connection holes, there is a method of forming a metal thin film having the communication holes on the insulating sheet including the resin and the fillers by a method such as transferring, vapor deposition, printing, and plating and subsequently crimping the insulating sheet or a method of spraying and diffusing conductor pieces, conductor powders, or conductor particles having shapes such as flakes, scales, slices, and flat plates so as to form the communication holes on the resin sheet, forming a conductor layer having the communication holes, and crimping the insulating sheet.

FIG. 13 is a graph showing experimental results for explaining an effect of lowering the thermal resistance and insulation performance in the case of using the intermediate conductor having the communication holes. To confirm the effect of lowering the thermal resistance in the case of using the intermediate conductor having the communication holes, the following sample is prepared. A resin insulating sheet containing a 150 mm square filler is placed on a 150 mm square Al plate having a thickness of 2 mm and an aluminum film conductor pattern with a thickness of 0.1 µm is formed on the insulating sheet with aluminum vapor deposition through masking in which a conductor pattern having a pattern of mesh-like communicating holes having a hole diameter (length of a diagonal line of a hole configuring a mesh) of 2 µm to 500 µm and having an interval of connection holes of 50 µm is formed on the resin insulating sheet. The resin insulating sheet containing the 150 mm square filler not patterned and a 100 mm square Al plate having a thickness of 2 mm are placed such that an aluminum film formed by the vapor deposition becomes an inner portion. Then, a sample is formed by heating and crimping and the thermal resistance and the partial discharge start voltage are measured.

In FIG. 13, a horizontal axis represents a hole diameter of the communication hole and a vertical axis represents normalized thermal resistance and a normalized partial discharge start voltage when thermal resistance of a sample is set as 1, in the case of using the intermediate conductor not having the communication hole. As shown in FIG. 13, the thermal resistance can be decreased by forming the communication hole in the intermediate conductor, as compared with the intermediate conductor not having the communication hole. By increasing the hole diameter of the communication hole, the thermal resistance gradually decreases even at a hole diameter of 2 µm or less. Meanwhile, if the size of the communication hole is increased, the partial discharge start voltage starts to show a large decrease at 100 µm or more. From this, it is understood that, if the hole diameter of the communication hole is controlled, the thermal resistance can be reduced without decreasing the partial discharge start voltage.

Similarly, an aluminum film conductor pattern with a thickness of 0.1 µm is formed on an insulating sheet by aluminum vapor deposition through masking in which a pattern of communication holes having a hole diameter (diameter of a hole configuring a mesh) of 10 µm and having a circular shape when seen from a plan view of an intermediate conductor forms a conductor pattern having an interval of connection holes of 30 µm on a resin insulating sheet. A resin insulating sheet containing a 150 mm square filler not patterned and a 100 mm square Al plate having a thickness of 2 mm are placed such that an aluminum film formed by the vapor deposition becomes an inner portion. Then, a sample is formed by crimping and the thermal resistance and the partial discharge start voltage are measured. In this case, the normalized thermal resistance is 0.83 and the normalized partial discharge start voltage is 1.0. As such, even if the intermediate conductor having the circular communication holes is used, the same effect can be obtained.

Figure 14:
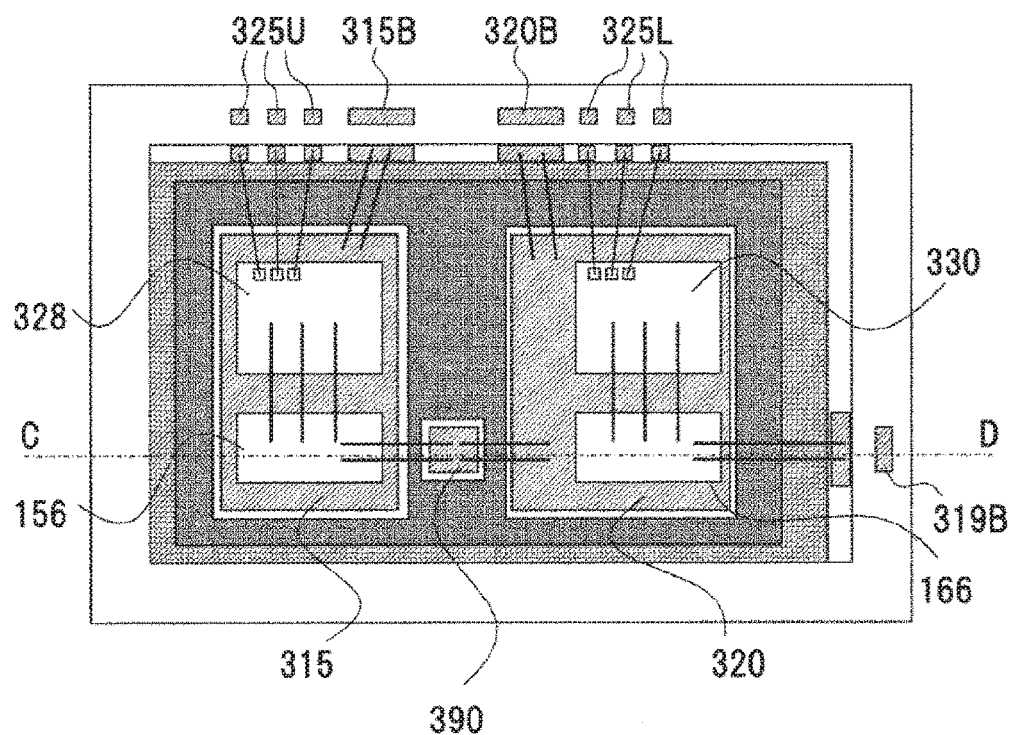
FIG. 14 is a plan view of a power module according to a second embodiment.
Figure 15:
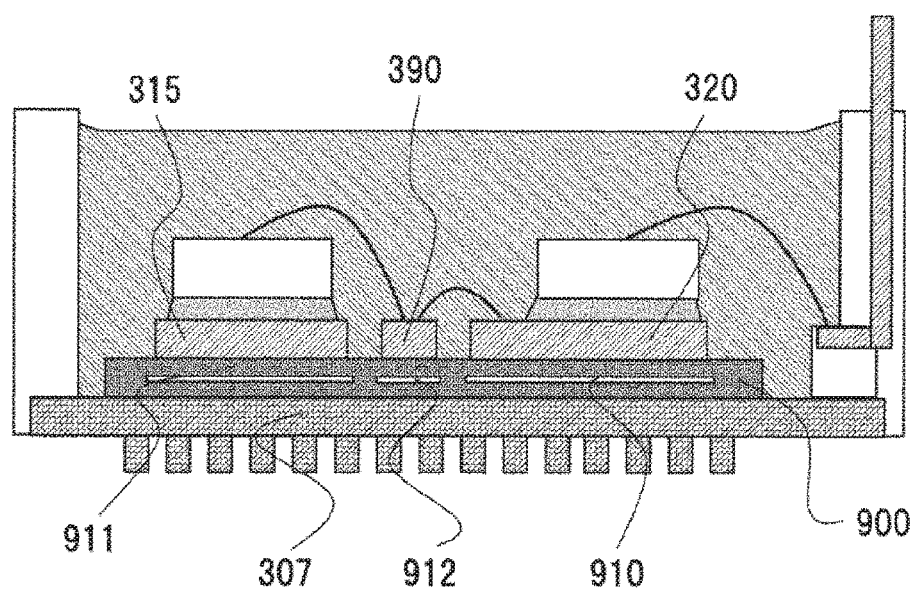
FIG. 15 is a cross-sectional view of the power module of FIG. 14 taken along the line C-D.

A power module according to a second embodiment will be described using FIGS. 14 and 15. The power module according to the second embodiment shows a modification of the power module according to the first embodiment. FIG. 14 is a plan view and FIG. 15 is a cross-sectional view of FIG. 14 taken along the line C-D.

In this embodiment, an electrode of an emitter side of a power semiconductor element is connected by wire. In addition, a conductor plate 320 connected to a collector side of an IGBT 330 of a lower arm side and an emitter surface of an IGBT 328 of an upper arm side are connected via an intermediate electrode 390. Similar to the conductor plates 320 and 315, the intermediate electrode 390 is disposed to face a heat radiation surface 307 with an insulating layer 900 therebetween. An intermediate conductor 912 is disposed between the intermediate electrode 390 and the heat radiation surface 307. Similar to intermediate conductors 910 and 911, the intermediate conductor 912 is buried in the insulating layer 900.

Similar to the conductor plate 320, because an AC voltage is applied to the intermediate electrode 390, the voltage can be shared by the intermediate conductor 912.

A power module according to a third embodiment will be described using FIGS. 16 to 20.

Figure 16A:
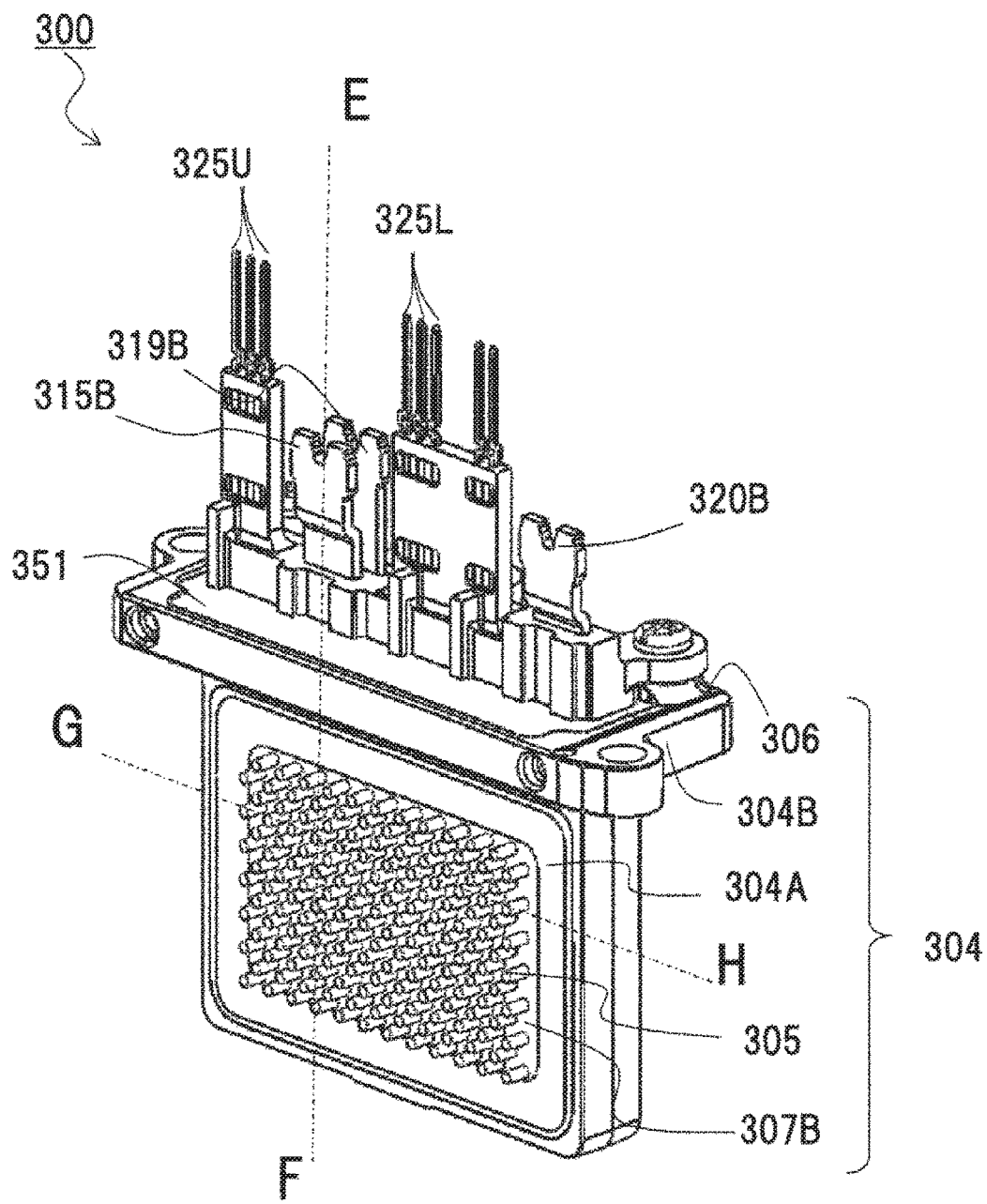
FIG. 16A is a perspective view of a power module according to a third embodiment.
Figure 16B:
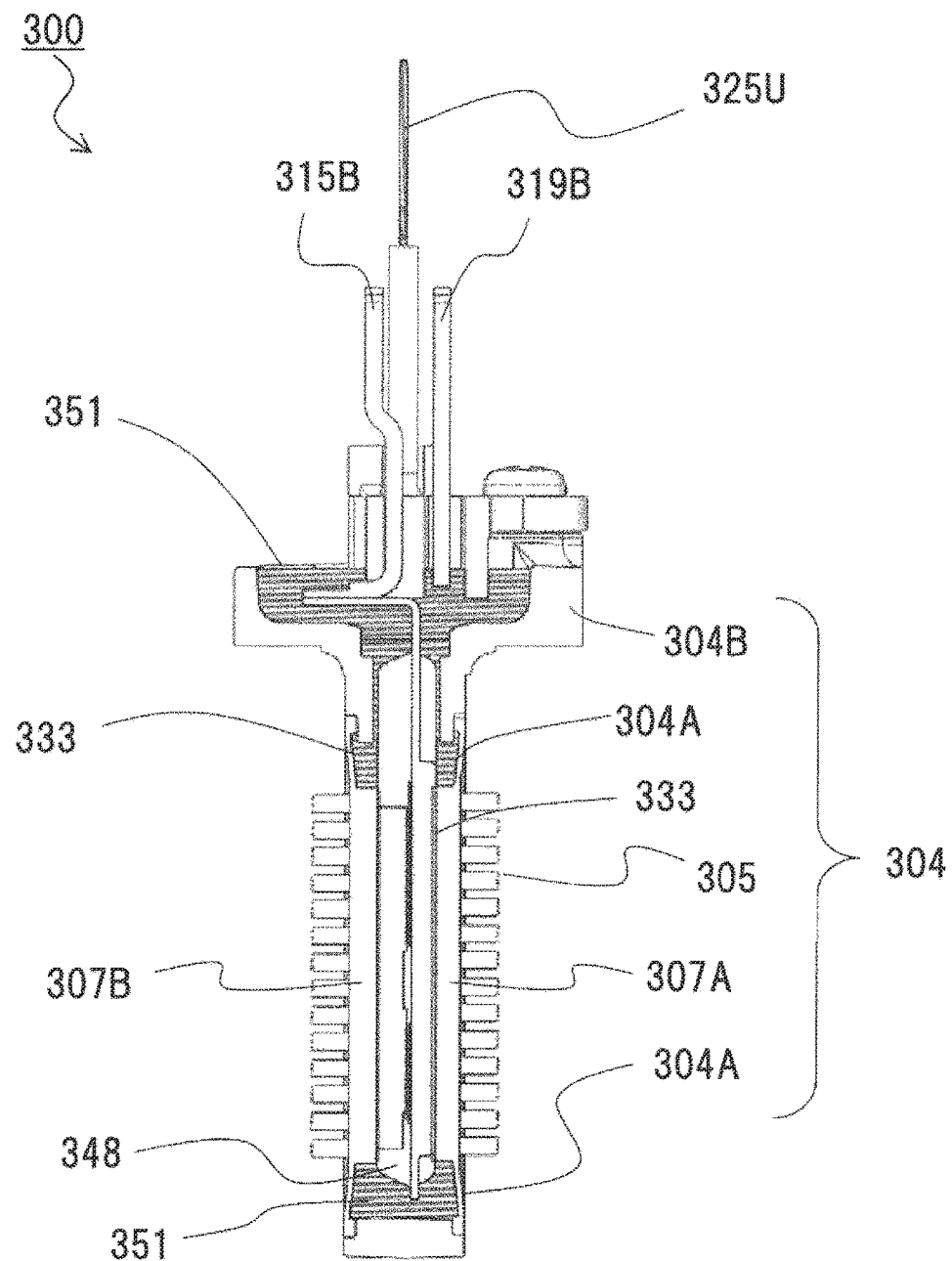
FIG. 16B is a cross-sectional view of the power module of FIG. 16(a) taken along the line E-F.

FIG. 16(a) is a perspective view of the power module according to this embodiment and FIG. 16(b) is a cross-sectional view taken along the line E-F in FIG. 16(a). A power module 300 according to this embodiment has a double-sided cooling structure in which a power semiconductor element is stored in a cooling body 304 to be a CAN-type cooler. The cooling body 304 has a first heat radiation surface 307A and a second heat radiation surface 307B provided with heat radiation fins 305, a thin portion 304A connecting the heat radiation surfaces and a frame body, and a flange portion 304B. A circuit body including a power semiconductor element or a conductor plate is inserted through an insertion port 306 of the cooling body 304 formed in a bottomed cylindrical shape and sealed with a sealing material 351 to form the power module 300. In the power module according to this embodiment, because the power semiconductor element is cooled from both sides of the first heat radiation surface 307A and the second heat radiation surface 307B, the power semiconductor element is superior in a heat radiation property.

Figure 17:
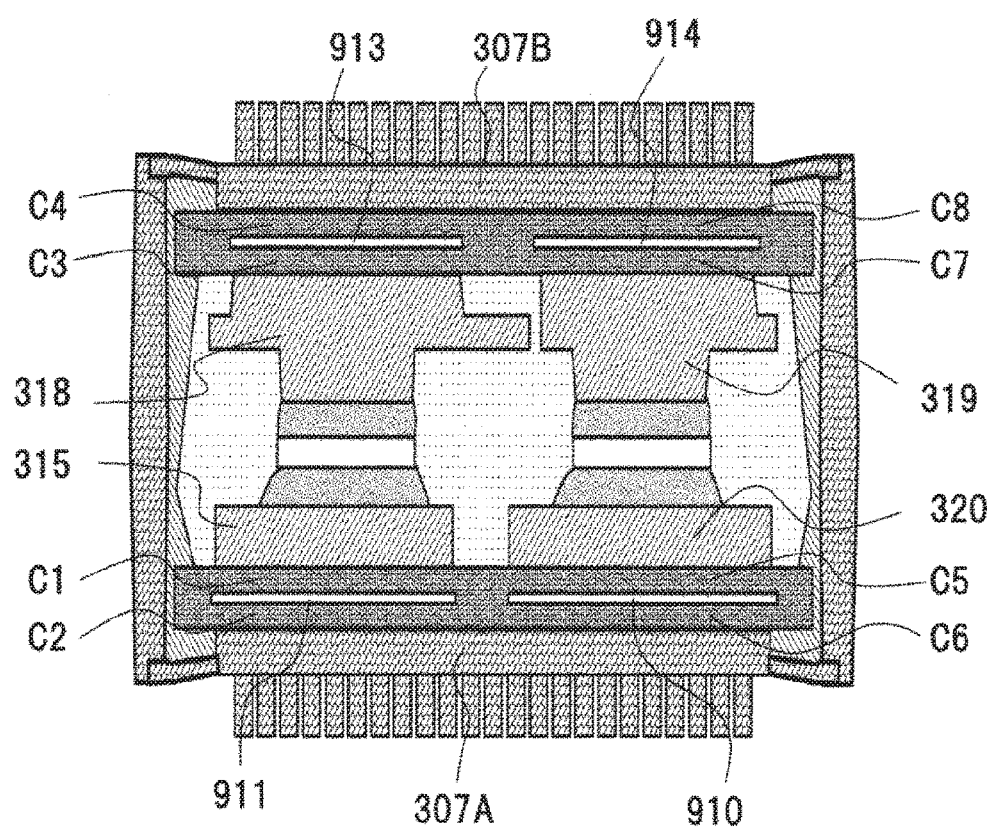
FIG. 17 is a schematic cross-sectional view of FIG. 16(a) taken along the line G-H.

FIG. 17 is a schematic cross-sectional view of FIG. 16(a) taken along the line G-H. The power module 300 according to this embodiment has intermediate conductors 910 and 911 in an insulating layer disposed on one side of the power semiconductor element. In addition, the power module 300 has intermediate conductors 913 and 914 in an insulating layer disposed on the other side of the power semiconductor element opposite to one side. The intermediate conductor 910 is disposed between a conductor plate 320 to which an AC voltage is applied and the heat radiation surface 307A. The intermediate conductor 911 is disposed between a conductor plate 315 to which a DC voltage is applied and the heat radiation surface 307A. The intermediate conductor 913 is disposed between a conductor plate 318 to which an AC voltage is applied and the heat radiation surface 307B. The intermediate conductor 914 is disposed between a conductor plate 319 to which a DC voltage is applied and the heat radiation surface 307B.

In addition, the individual intermediate conductors form capacity circuits C1 to C8. The capacitor C1 is a capacitor between the conductor plate 315 and the intermediate conductor 911. The capacitor C2 is a capacitor between the intermediate conductor 911 and the heat radiation surface 307A. The capacitor C3 is a capacitor between the conductor plate 318 and the intermediate conductor 913. The capacitor C4 is a capacitor between the intermediate conductor 913 and the heat radiation surface 307B. The capacitor C5 is a capacitor between the conductor plate 320 and the intermediate conductor 910. The capacitor C6 is a capacitor between the intermediate conductor 910 and the heat radiation surface 307A. The capacitor C7 is the capacitor between the conductor plate 319 and the intermediate conductor 914. The capacitor C8 is a capacitor between the intermediate conductor 914 and the heat radiation surface 307B. However, in the capacitors C1 and C2 between the conductor plate 315 to which the DC voltage is applied and the heat radiation surface 307A and the capacitors C8 and C9 between the conductor plate 319 to which the DC voltage is applied and the heat radiation surface 307B, the capacity circuits are formed only when the DC voltage changes.

Figure 18:
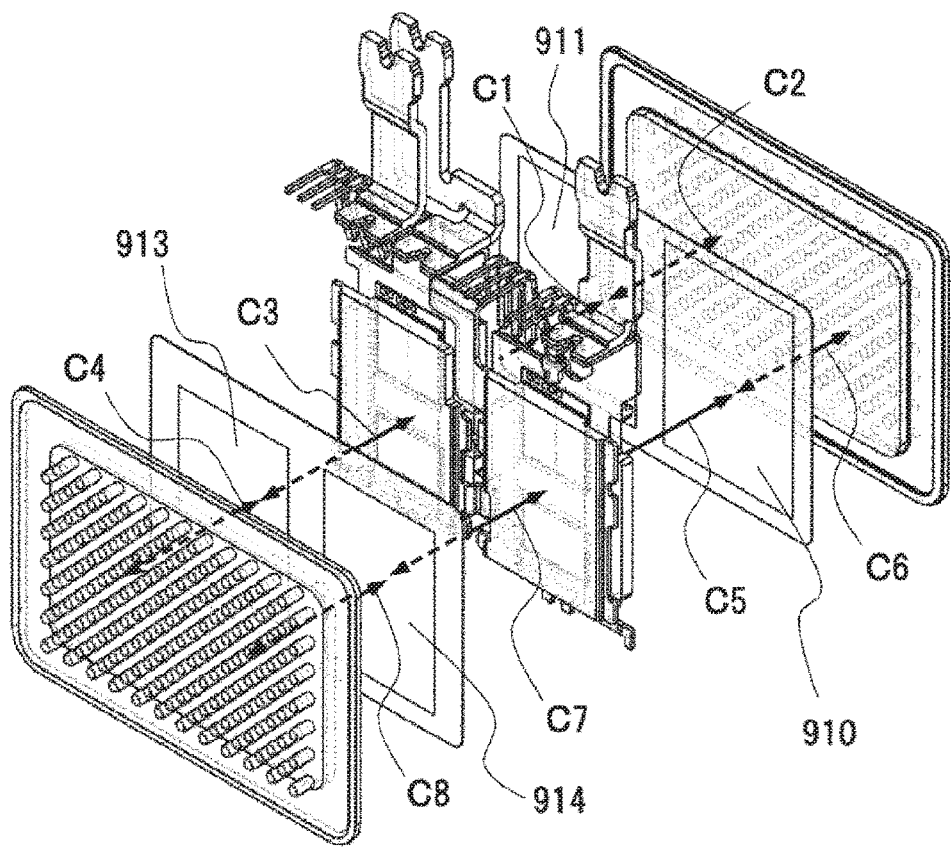
FIG. 18 is a development view illustrating an arrangement of intermediate conductors in the power module according to the third embodiment.

FIG. 18 is a development view for explaining an arrangement of the intermediate conductors in the power module according to this embodiment. For the sake of description, only a partial configuration is shown in the drawing.

Figure 19:
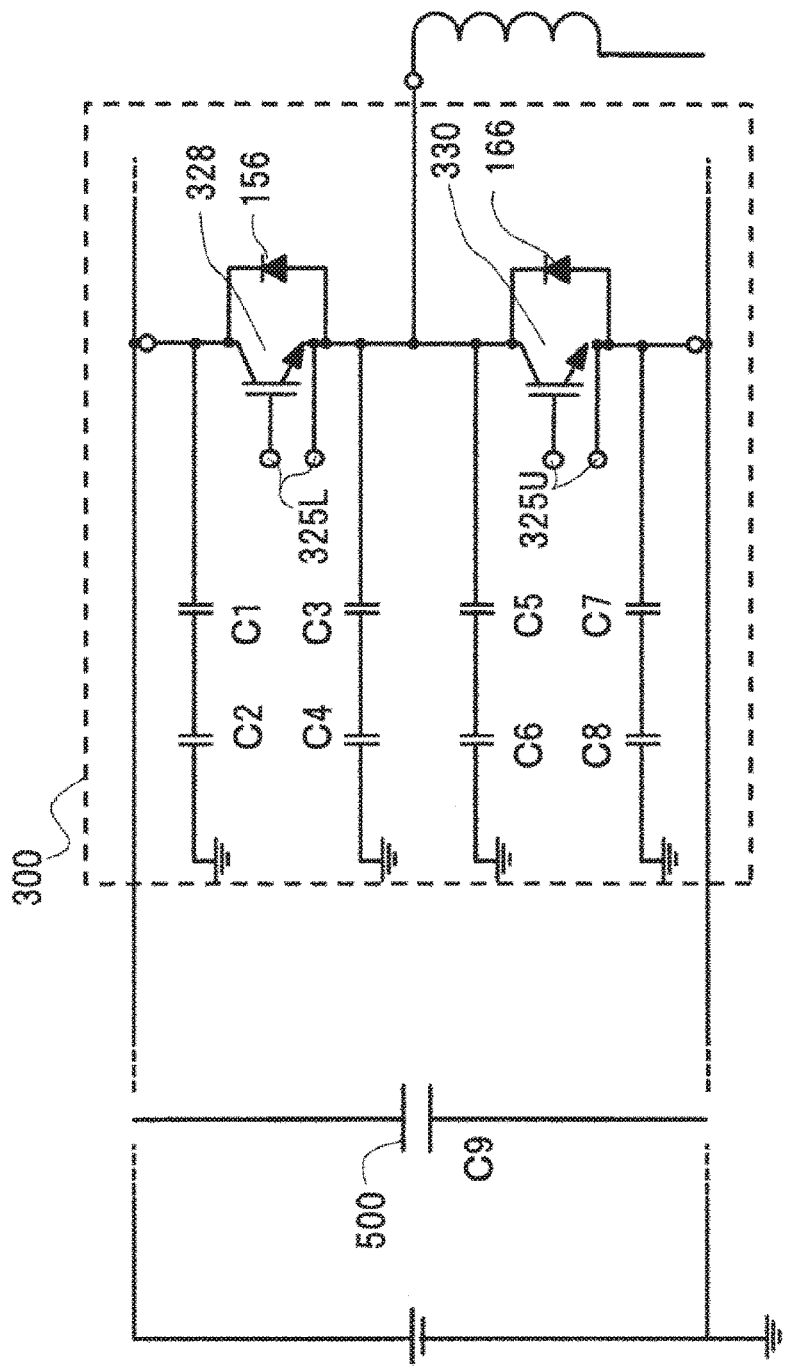
FIG. 19 is a circuit diagram of the power module and a peripheral portion thereof.

FIG. 19 is a diagram showing the capacitors C1 to C8 in a circuit diagram of the power module. The capacitors C1, C2, C8, and C7 are portions to which a DC voltage is applied. Therefore, the intermediate conductors 911 and 914 of these portions can be omitted. The capacitors C3, C4, C5, and C6 are portions to which an AC voltage is applied. Therefore, the intermediate conductors 910 and 913 of these portions can share the voltage applied to the insulating layer.

In the power module according to this embodiment to be the power module of the double-sided cooling structure with superior cooling performance, an intermediate conductor structure is provided in the insulating layer, so that the insulating layer can be thinned, and it is possible to obtain a power module of a high breakdown voltage having a superior heat radiation property.

Figure 20A:
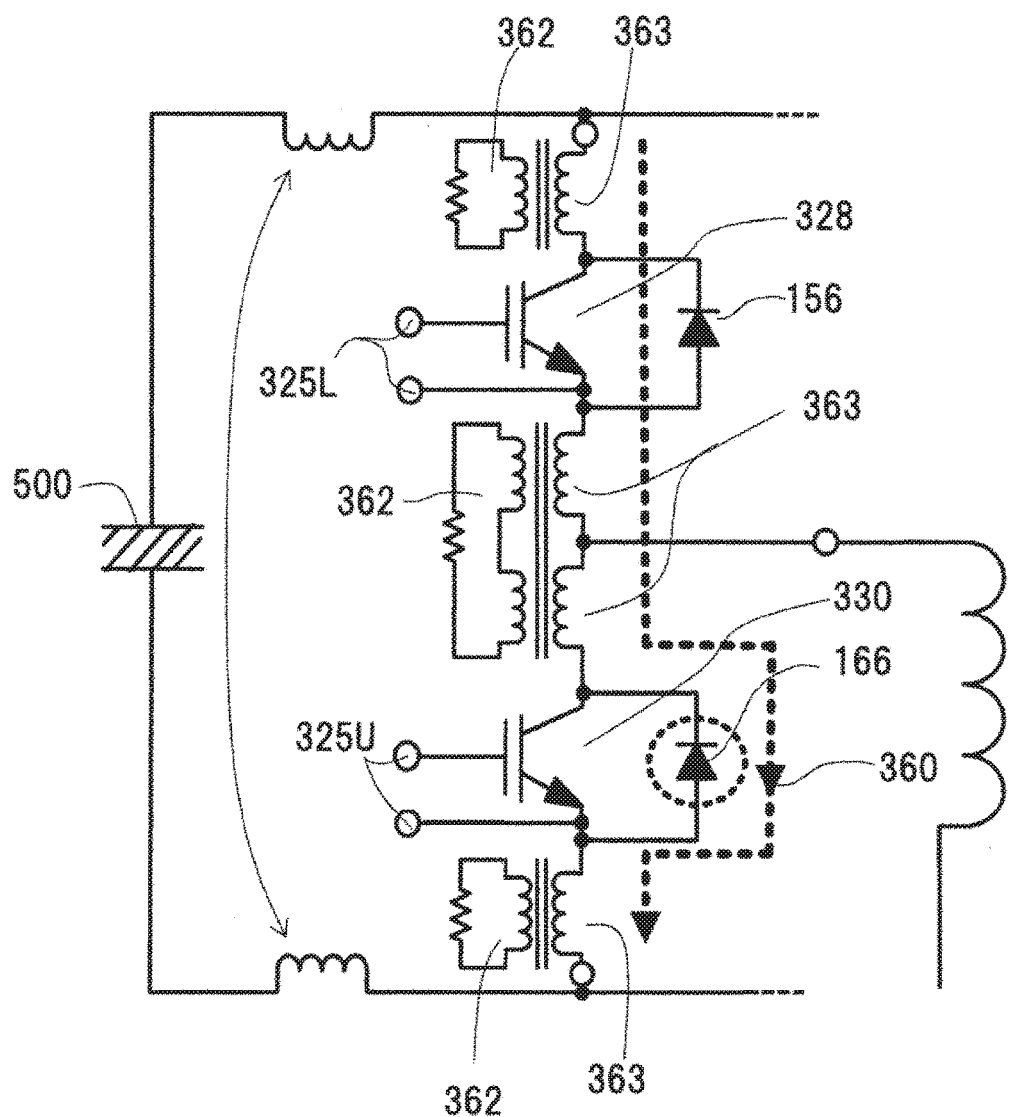
FIG. 20A is a circuit diagram showing an explanatory diagram of inductance reduction.
Figure 20B:
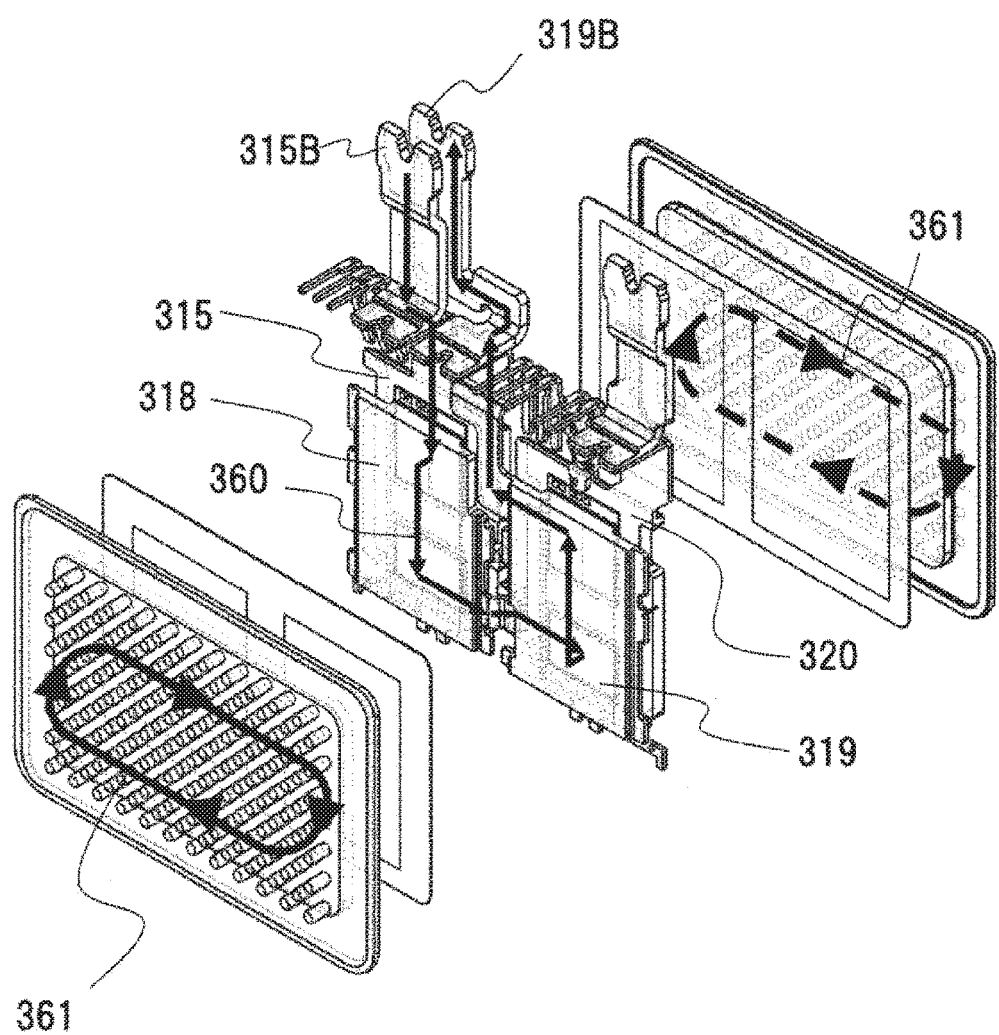
FIG. 20B is a development view of the power module showing an explanatory diagram of inductance reduction.

Reduction of inductance in the power module according to this embodiment will be described using FIGS. 20(a) and 20(b). FIG. 20(a) is a circuit diagram of the power module 300 according to this embodiment. FIG. 20(b) is a development view of the power module 300.

A state in which a diode 166 of a lower arm side is conducted in a forward bias state is assumed. In this state, when an IGBT 328 of an upper arm side is turned on, a diode 166 of a lower arm side is biased in a reverse direction and a recovery current resulting from a carrier movement passes through upper and lower arms. At this time, a recovery current 360 shown in FIG. 20(b) flows through the conductor plates 315, 3318, 320, and 319. The recovery current 360 flows through a DC positive electrode terminal 315B disposed to face a DC negative electrode terminal 319B. Subsequently, the recovery current flows through a loop-shaped path formed by the conductor plates 315, 318, 320, and 319. In addition, the recovery current flows through the DC negative electrode terminal 319B.

The current flows through the loop-shaped path, so that an eddy current 361 flows through the first heat radiation surface 307A and the second heat radiation surface 307B of the cooler 304. By a magnetic field offset effect generated by an equivalent circuit 362 in a current path of the eddy current 361, wiring inductance 363 in the loop-shaped path is reduced. When a current path of the recovery current 360 is closer to the loop shape, an inductance reduction action increases. As such, a 2in1 structure in which an upper arm circuit and a lower arm circuit are modularized as one set is formed, so that the inductance can be reduced by the magnetic field offset effect. The same effect can be obtained even if 2in1 increases to 4in1 and 6in1.

A power module according to a fourth embodiment will be described using FIG. 21.

Figure 21:
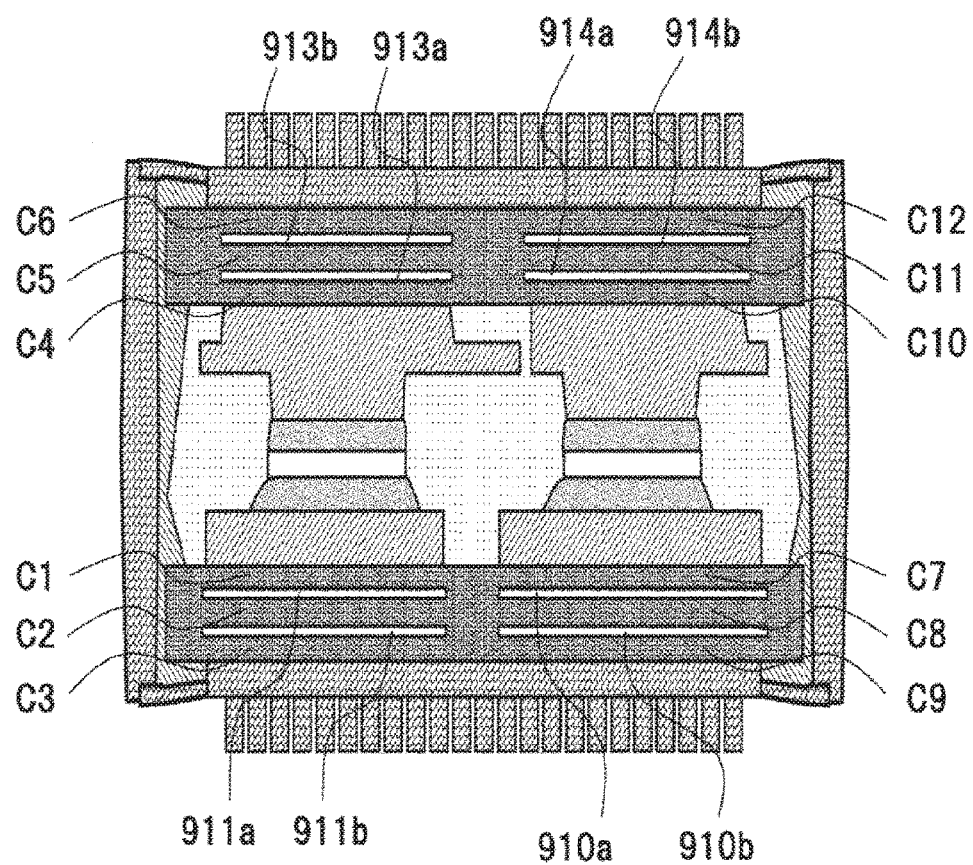
FIG. 21 is a cross-sectional view of a power module according to a fourth embodiment.

FIG. 21 is a cross-sectional view of the power module according to this embodiment. FIG. 21 corresponds to FIG. 17 showing the power module according to the third embodiment. A change from the third embodiment is an increase in the number of intermediate conductors.

Intermediate conductors 910a and 910b are disposed between a conductor plate 320 to which an AC voltage is applied and a heat radiation surface 307A. Intermediate conductors 911a and 911b are disposed between a conductor plate 315 to which a DC voltage is applied and the heat radiation surface 307A. Intermediate conductors 913a and 913b are disposed between a conductor plate 318 to which an AC voltage is applied and a heat radiation surface 307B. Intermediate conductors 914a and 914b are disposed between a conductor plate 319 to which a DC voltage is applied and the heat radiation surface 307B.

In addition, the individual intermediate conductors form capacity circuits C1 to C12. The capacitor C1 is a capacitor between the conductor plate 315 and the intermediate conductor 911a. The capacitor C2 is a capacitor between the intermediate conductor 911a and the intermediate conductor 911b. The capacitor C3 is a capacitor between the intermediate conductor 911b and the heat radiation surface 307A.

The capacitor C4 is a capacitor between the conductor plate 318 and the intermediate conductor 913a. The capacitor C5 is a capacitor between the intermediate conductor 913a and the intermediate conductor 913b. The capacitor C6 is a capacitor between the intermediate conductor 913b and the heat radiation surface 307B. The capacitor C7 is a capacitor between the conductor plate 320 and the intermediate conductor 910a. The capacitor C8 is a capacitor between the intermediate conductor 910a and the intermediate conductor 910b. The capacitor C9 is a capacitor between the intermediate conductor 910b and the heat radiation surface 307A. The capacitor C10 is a capacitor between the conductor plate 319 and the intermediate conductor 914a. The capacitor C11 is a capacitor between the intermediate conductor 914a and the intermediate conductor 914b. The capacitor C12 is a capacitor between the intermediate conductor 914b and the heat radiation surface 307B. However, in the capacitors C1, C2, and C3 between the conductor plate 315 to which the DC voltage is applied and the heat radiation surface 307A and the capacitors C10, C11, and C12 between the conductor plate 319 to which the DC voltage is applied and the heat radiation surface 307B, the capacity circuits are formed only when the DC voltage changes.

In the power module according to this embodiment, because a voltage applied to an insulating layer can be shared by three, a total thickness of the insulating layer can be further reduced.

Figure 22:
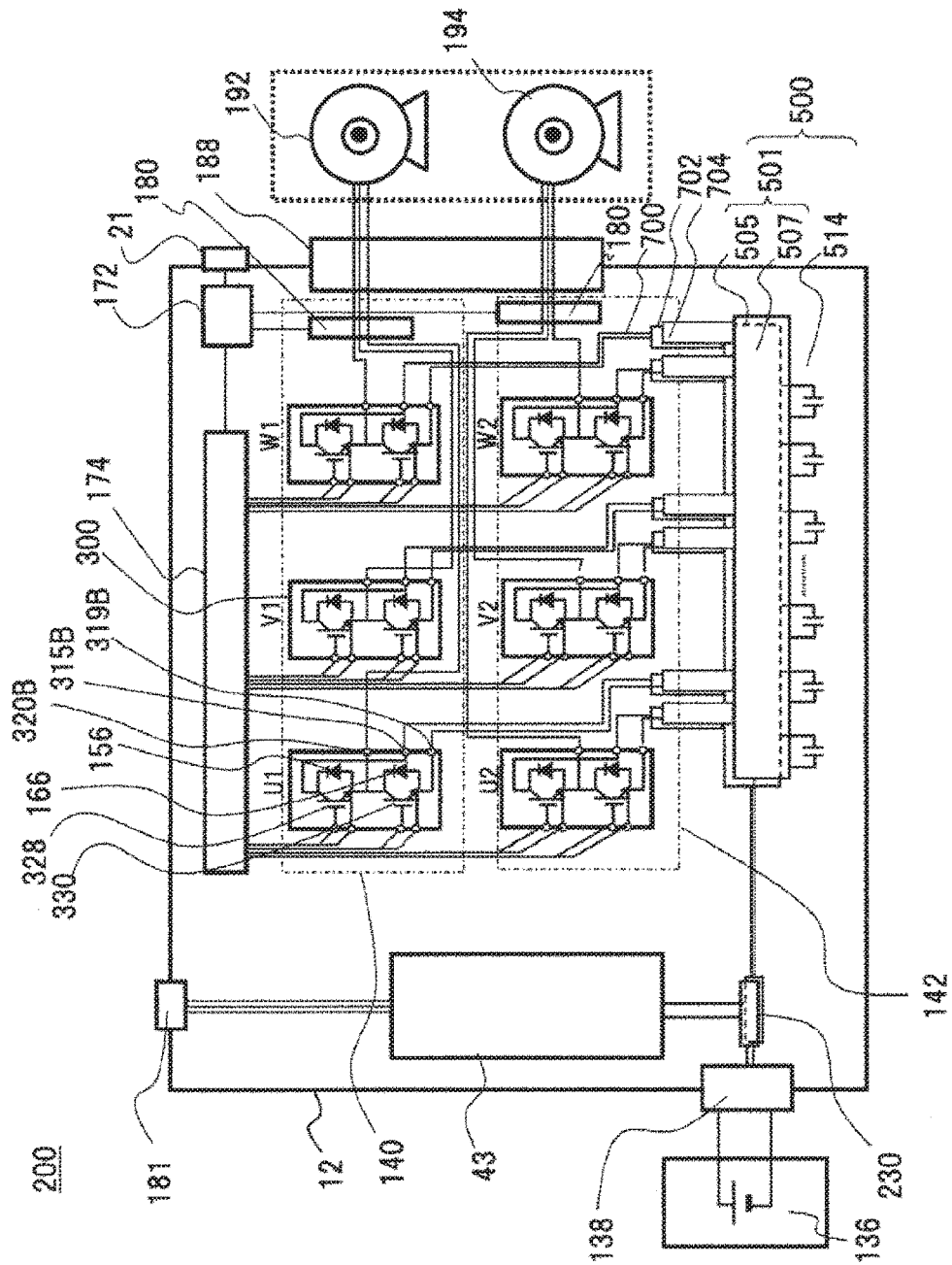
FIG. 22 is a circuit diagram of a power conversion device.

A configuration example of a power conversion device and a vehicle system incorporating a power module according to the present invention will be described using FIGS. 22 to 24. FIG. 22 shows a circuit diagram of the power conversion device.

A power conversion device 200 includes inverter circuit units 140 and 142, an inverter circuit unit 43 for an auxiliary machine, and a capacitor module 500. Each of the inverter circuit units 140 and 142 includes a plurality of power modules 300 and configures a three-phase bridge circuit by connecting the plurality of power modules 300. When a current capacity is large, the power modules 300 are connected in parallel and this parallel connection is performed to correspond to each phase of a three-phase inverter circuit, so that it is possible to cope with an increase in the current capacity. In addition, power semiconductor elements embedded in the power modules 300 are connected in parallel, so that it is possible to cope with the increase in the current capacity.

The inverter circuit unit 140 and the inverter circuit unit 142 have the same basic circuit configuration and a control method and an operation thereof are also basically the same. Here, the inverter circuit unit 140 is described as a representative example. The inverter circuit unit 140 has a three-phase bridge circuit as a basic configuration. Specifically, each of arm circuits that operate as a U phase (represented by a reference symbol U1), a V phase (represented by a reference symbol V1), and a W phase (represented by a reference symbol W1) is connected in parallel with conductors of a positive electrode side and a negative electrode side transmitting DC power. Similar to the case of the inverter circuit unit 140, arm circuits that operate as a U phase, a V phase, and a W phase of the inverter circuit unit 142 are represented by reference symbols U2, V2, and W2, respectively.

The arm circuit of each phase is composed of an upper/lower arm series circuit in which an upper arm circuit and a lower arm circuit are connected in series. The upper arm circuit of each phase is connected to the conductor of the positive electrode side and the lower arm circuit of each phase is connected to the conductor of the negative electrode side. AC power is generated in a connection portion of the upper arm circuit and the lower arm circuit. The connection portion of the upper arm circuit and the lower arm circuit of each upper/lower arm series circuit is connected to an AC terminal 320B of each power module 300. The AC terminal 320B of each power module 300 is connected to an AC output terminal of the power conversion device 200 and the generated AC power is supplied to a stator winding of a motor generator 192 or 194. Because each power module 300 of each phase basically has the same structure and an operation thereof is basically the same, the U phase (U1) of the power module 300 is described as a representative example.

The upper arm circuit includes an IGBT 328 for an upper arm and a diode 156 for the upper arm as power semiconductor elements for switching. In addition, the lower arm circuit includes an IGBT 330 for a lower arm and a diode 166 for the lower arm as power semiconductor elements for switching. The DC positive electrode terminal 315B and the DC negative electrode terminal 319B of each upper/lower arm series circuit are connected to a DC terminal for capacitor connection in the capacitor module 500. The AC power output from the AC terminal 320B is supplied to the motor generators 192 and 194.

The IGBTs 328 and 330 receive a drive signal output from one or the other of two driver circuits configuring a driver circuit 174, perform a switching operation, and convert DC power supplied from a battery 136 into three-phase AC power. The converted power is supplied to the stator winding of the motor generator 192. Because the V phase and the W phase have substantially the same circuit configuration as the U phase, display of reference numerals 328, 330, 156, and 166 is omitted. Because the power module 300 of the inverter circuit unit 142 has the same configuration as the case of the inverter circuit unit 140 and the inverter circuit unit 43 for the auxiliary machine has the same configuration as the inverter circuit unit 142, description thereof is omitted herein.

The power semiconductor elements for the switching will be described using the IGBT 328 for the upper arm and the IGBT 330 for the lower arm. The IGBT 328 for the upper arm or the IGBT 330 for the lower arm includes a collector electrode, an emitter electrode (emitter electrode terminal for a signal), and a gate electrode (gate electrode terminal). The diode 156 for the upper arm or the diode 166 for the lower arm is electrically connected between the collector electrode and the emitter electrode of the IGBT 328 for the upper arm or the IGBT 330 for the lower arm as shown in the drawing.

The diode 156 for the upper arm or the diode 166 for the lower arm has two electrodes of a cathode electrode and an anode electrode. The cathode electrodes of the diodes 156 and 166 are electrically connected to the collector electrodes of the IGBTs 328 and 330 and the anode electrodes thereof are electrically connected to the emitter electrodes of the IGBTs 328 and 330, such that a direction toward the collector electrodes of the IGBT 328 for the upper arm and the IGBT 330 for the lower arm from the emitter electrodes thereof becomes a forward direction. A metal oxide semiconductor field effect transistor (MOSFET) may be used as the power semiconductor element. In this case, the diode 156 for the upper arm and the diode 166 for the lower arm are unnecessary.

From a temperature sensor (not shown) provided in the upper/lower arm series circuit, temperature information of the upper/lower arm series circuit is input to a microcomputer. In addition, voltage information of the DC positive electrode side of the upper/lower arm series circuit is input to the microcomputer. The microcomputer detects an excess temperature and an excess voltage on the basis of the information. When the excess temperature or the excess voltage is detected, the microcomputer stops the switching operations of both the IGBT 328 for the upper arm and the IGBT 330 for the lower arm and protects the upper/lower arm series circuit from the excess temperature or the excess voltage.

Figure 23:
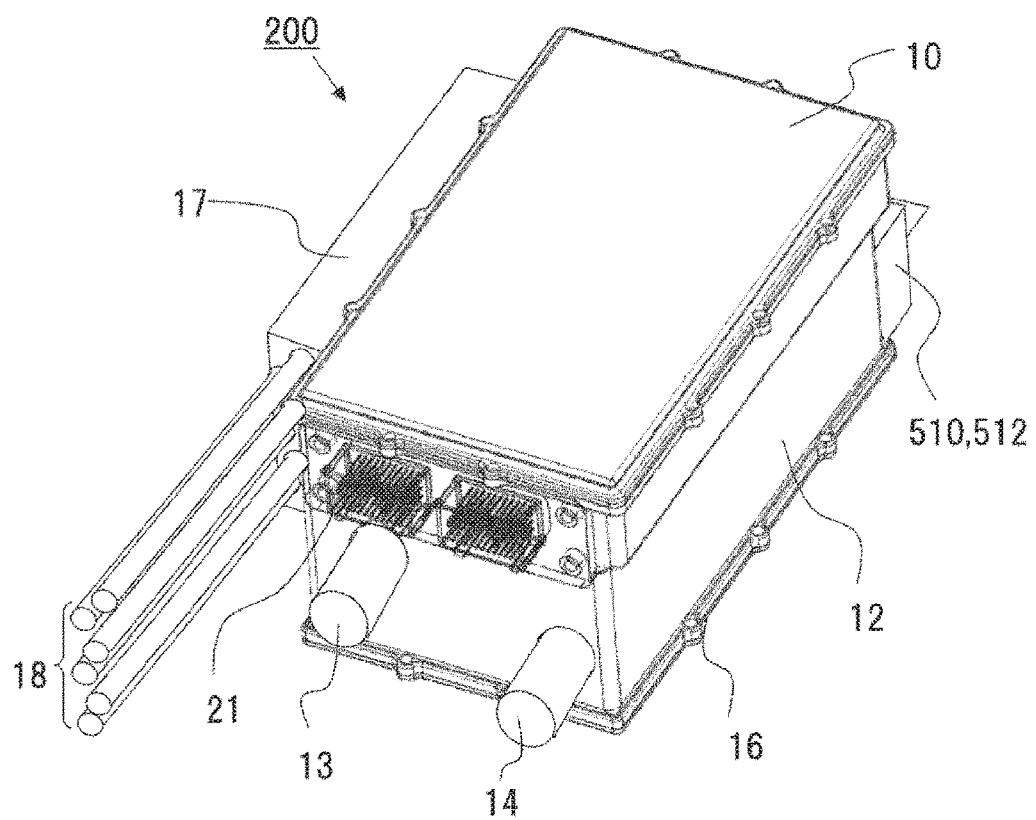
FIG. 23 is a perspective view showing an external appearance of the power conversion device.

FIG. 23 is a perspective view showing an external appearance of the power conversion device 200. The external appearance of the power change device 200 according to this embodiment is formed by fixing a casing 12 of which a top surface or a bottom surface has a substantially rectangular shape, an upper case 10 provided on one of outer circumferences of the short side of the casing 12, and a lower case 16 to close a lower opening of the casing 12. A bottom view or a top view of the casing 12 is configured to have a substantially rectangular shape, so that mounting on a vehicle is easy and production is easy.

Figure 24:
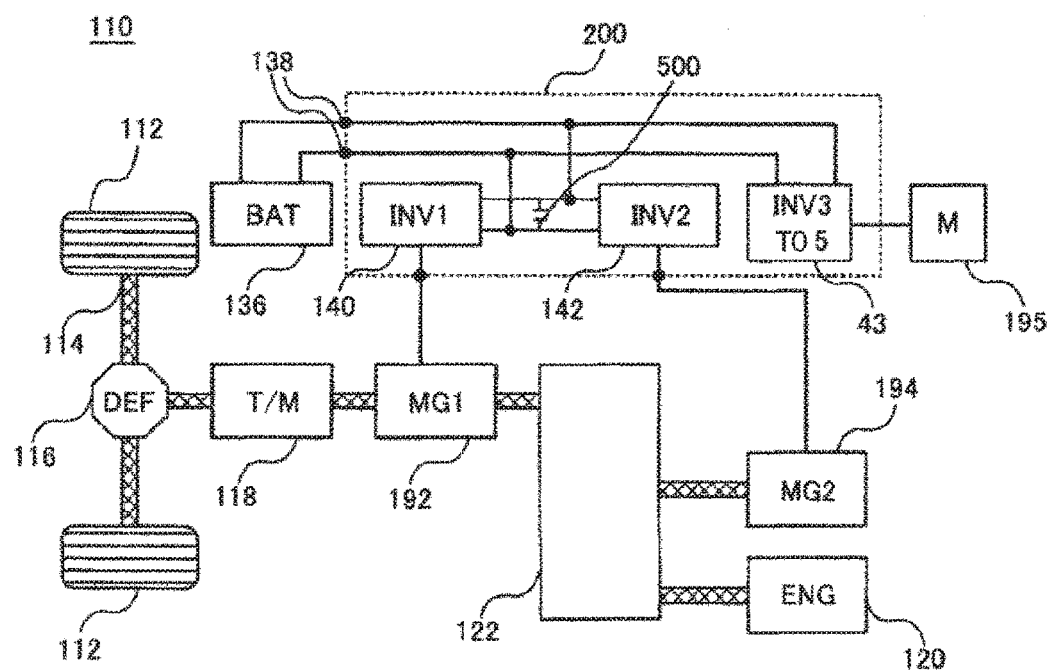
FIG. 24 is a control block diagram of a hybrid vehicle.

FIG. 24 is a control block diagram of a hybrid vehicle on which a power conversion device is mounted. A hybrid vehicle (HEV) 110 includes two vehicle drive systems. One is an engine drive system using an engine 120 as a power source and the other is a rotary electric machine drive system using motor generators 192 and 194 as a power source. The power conversion device 200 according to the present invention performs DC and AC power conversions between the battery 136, the motor generators 192 and 194, and a motor 195 for an auxiliary machine, optimally controls supplying of drive power to the motor or power regeneration from the motor according to a traveling state of the vehicle, and contributes to improvement of fuel efficiency.

REFERENCE SIGNS LIST 10 upper case
12 casing
16 lower case
18 AC terminal
22 drive circuit board
43 inverter circuit
110 hybrid vehicle
112 front wheel
114 front wheel axle
116 differential gear
118 transmission
120 engine
122 power distribution mechanism
136 battery
138 DC connector
140 inverter circuit
142 inverter circuit
156 diode
166 diode
172 control circuit
174 driver circuit
180 current sensor
192 motor generator
194 motor generator
195 motor
200 power conversion device
230 input lamination wiring board
300 power module
304 cooling body
304A thin portion of cooling body
304B flange
305 heat radiation fin
306 insertion port
307 heat radiation surface
307A first heat radiation surface
307B second heat radiation surface
315 DC positive electrode conductor plate
315B DC positive electrode terminal
319 DC negative electrode conductor plate
319B DC negative electrode terminal
318 conductor plate
320B AC terminal
328 IGBT
330 IGBT
333 insulating sheet
348 first sealing material
350 thick portion of cooling body
351 second sealing material
370 connection portion
500 capacitor module
800 electrode
801 intermediate conductor
802 electrode
803 electrode
804 electrode
810 insulating layer
811 insulating layer
850 air layer
851 insulating layer
900 insulating layer
910 AC side intermediate conductor
911 DC side intermediate conductor
912 AC side intermediate conductor
913 AC side intermediate conductor
914 DC side intermediate conductor
1000 curve tracer
1001 transmitter
1002 DC power supply
1100 conductor
1101 communication region (communication hole)

The invention claimed is:

1. A power module, comprising:
a conductor plate to which a switching element is connected;
a heat radiation plate which is disposed to face the conductor plate;
an insulating member which is disposed between the conductor plate and the heat radiation plate; and
a conductive intermediate conductor which is disposed in the insulating member in a state of being electrically insulated from the conductor plate and the heat radiation plate,
wherein the intermediate conductor has a communication region which communicates between the insulating member disposed on the side of the conductor plate with respect to the intermediate conductor and the insulating member disposed on the side of the heat radiation plate with respect to the intermediate conductor.

2. The power module according to claim 1, wherein the insulating member is formed of a resin with a regular structure.

3. The power module according to claim 1, wherein the insulating member is formed of a resin containing a filler.

4. The power module according to claim 3, wherein the penetration region is formed to have a particle diameter larger than a particle diameter of the filler.

5. The power module according to claim 1, wherein the intermediate conductor is a lattice-like conductor in which a plurality of penetration regions are formed.

6. The power module according to claim 1, wherein the conductor plate transmits an alternating current.

7. The power module according to claim 1, wherein the intermediate conductor is formed such that a width of the intermediate conductor in a direction vertical to an arrangement direction of the conductor plate and the heat radiation plate is larger than a width of the conductor plate in the same direction.

\* \* \* \* \*